US008841921B1

(12) United States Patent  (10) Patent No.: US 8,841,921 B1
Tsironis  (45) Date of Patent: Sep. 23, 2014

(54) ADJUSTABLE SIGNAL SAMPLING SENSOR AND METHOD

(76) Inventor: Christos Tsironis, Kirkland (CA)

( * ) Notice: Subject to any disclaimer, the term of this patent is extended or adjusted under 35 U.S.C. 154(b) by 404 days.

(21) Appl. No.: 13/181,024

(22) Filed: Jul. 12, 2011

(51) Int. Cl.
*G01R 33/02* (2006.01)
*G01R 27/32* (2006.01)
*G01R 27/02* (2006.01)
*G01R 27/28* (2006.01)
*G01R 1/067* (2006.01)
*H01P 5/04* (2006.01)
*G01R 31/28* (2006.01)

(52) U.S. Cl.
CPC ............ *G01R 31/2839* (2013.01); *G01R 27/28* (2013.01); *G01R 1/06772* (2013.01); *H01P 5/04* (2013.01)
USPC ............ 324/601; 324/244; 324/637; 324/605

(58) Field of Classification Search
CPC ............... G01R 31/2839; G01R 27/28; G01R 1/06772; H01P 5/04
USPC .................................. 324/601, 244, 637, 605
See application file for complete search history.

(56) References Cited

U.S. PATENT DOCUMENTS

| 6,674,293 | B1 | 1/2004 | Tsironis | |
| 7,135,941 | B1 * | 11/2006 | Tsironis | 333/17.3 |
| 7,548,069 | B2 * | 6/2009 | Simpson | 324/537 |
| 7,561,004 | B1 * | 7/2009 | Tsironis | 333/17.3 |
| 2009/0295379 | A1 * | 12/2009 | Ide | 324/244 |

FOREIGN PATENT DOCUMENTS

SE        EP 1 316 806 A1       6/2003

OTHER PUBLICATIONS

Directional Couplers, Microwave Encyclopedia, http://www.microwaves101.com/encyclopedia/directionalcouplers.cfm.
Sischka, Franz, "Basics of S-Parameters, part 1", Characterization handbook, Mar. 2002.
Stenarson, J. and Yhland K., "An In-Circuit Noncontacting Measurement Method for S-Parameters and Power in Planar Circuits", IEEE Transactions on Microwave Theory and Techniques, vol. 49, No. 12, Dec. 2001, pp. 2567-2572.
Tucker, R.S. and Bradley P., "Computer-Aided Error Correction of Large-Signal Load-Pull Measurements", IEEE Transactions on Microwave Theory and Techniques, vol. MTT-32, No. 3, Mar. 1984, p. 296-300.
Fourier Transformation, http://en.wikipedia.org/wiki/Fourier_transform.
"MPT, a Universal Multi-Purpose Tuner, Product Note 79", Focus Microwaves Inc., Oct. 2004, www.focus-microwaves.com.

* cited by examiner

*Primary Examiner* — Melissa Koval
*Assistant Examiner* — Farhana Hoque

(57) ABSTRACT

Wideband low loss signal couplers use an electric field antenna for voltage detection and a magnetic loop for current detection both placed inside and coupled to the center conductor of a coaxial or parallel plate airline. The signal coupling factor increases with frequency thus favoring detection of harmonic components generated by the nonlinearly operated RF transistors. In order to adapt also to various power levels and associated harmonic receiver sensitivity the detectors can be adjusted such as to vary the basic level of coupling. A calibration method allows considering non-infinite directivity of the signal couplers to be accurately considered even when they are terminated with very high VSWR, generated by impedance tuners connected to the signal couplers.

4 Claims, 33 Drawing Sheets

Setup for calibrating the Tuner in the Coupler-Tuner assembly.

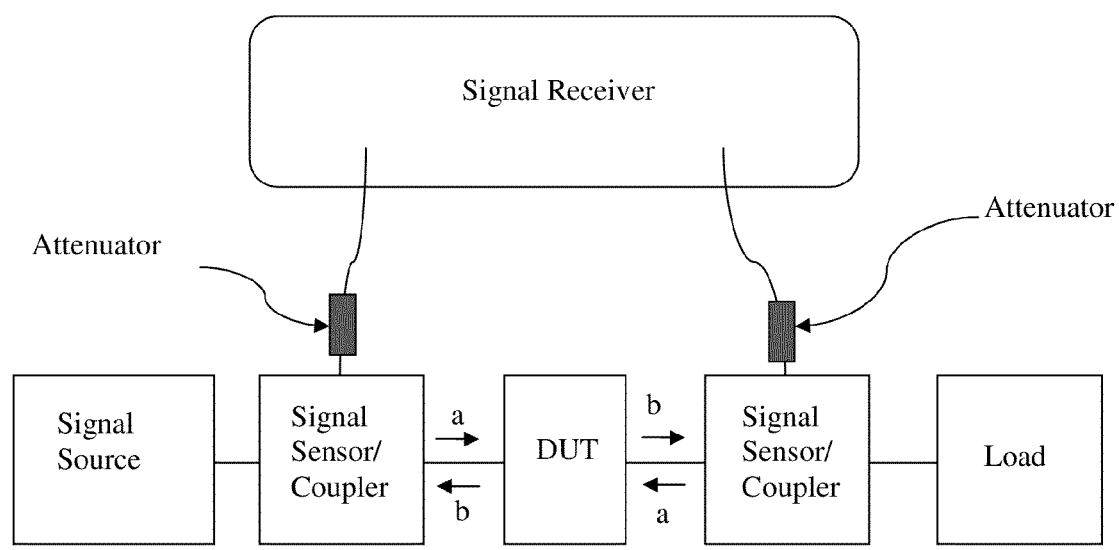
Figure 1: Prior art, signal measurement system using signal probing.

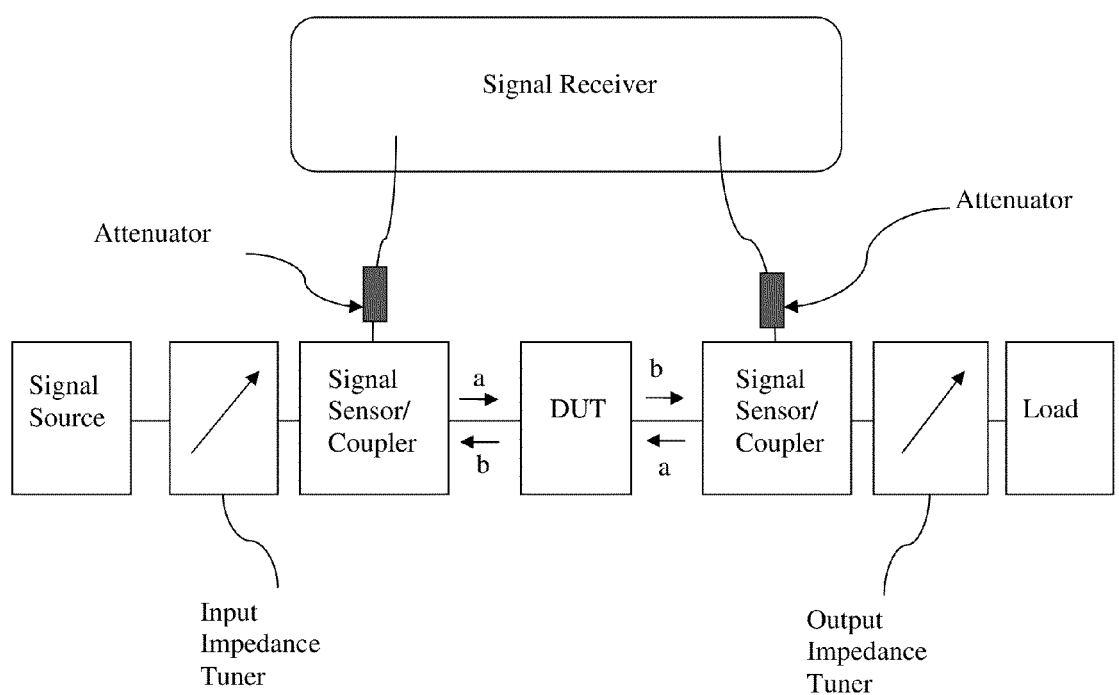
Figure 2: Prior art, signal measurement system using signal probing and impedance tuners.

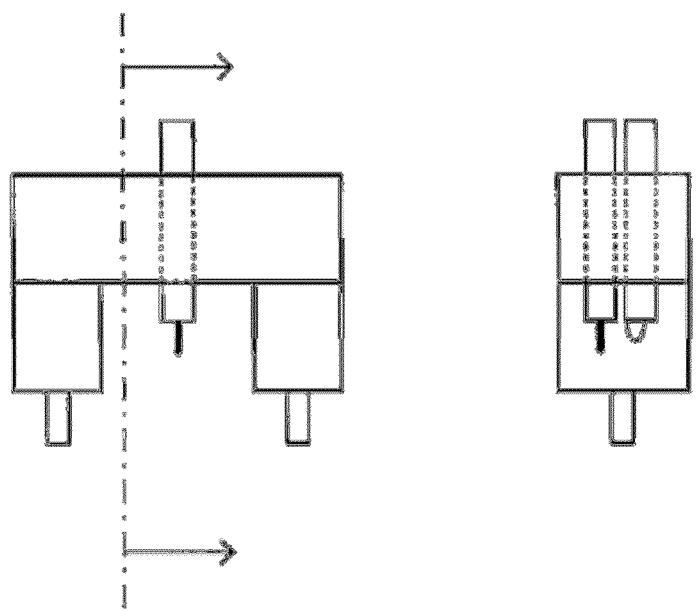
Figure 3: Prior art [4], concept of IV sensor/probe.

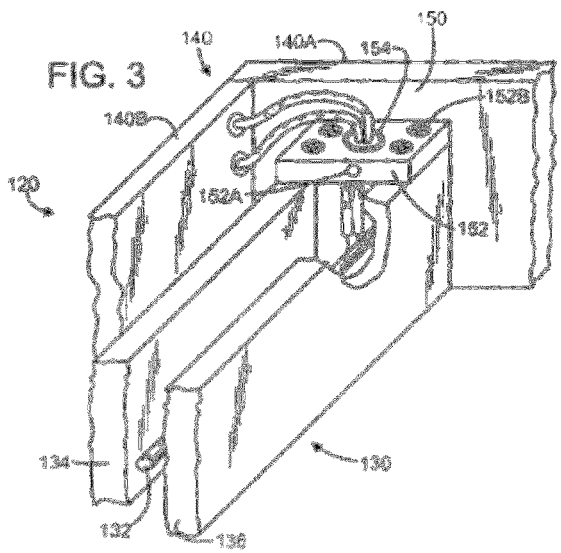
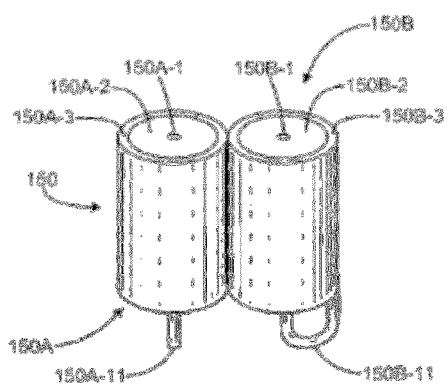
Figure 4: Prior art [3], IV sensor/probe setup.

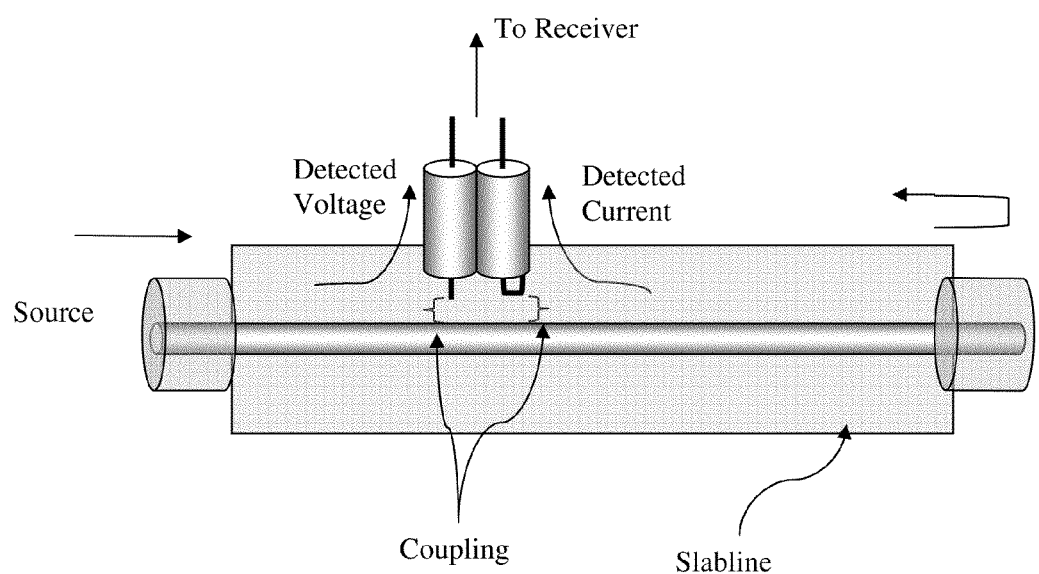
Figure 5: Prior art [1], [2], fixed IV sensor assembly.

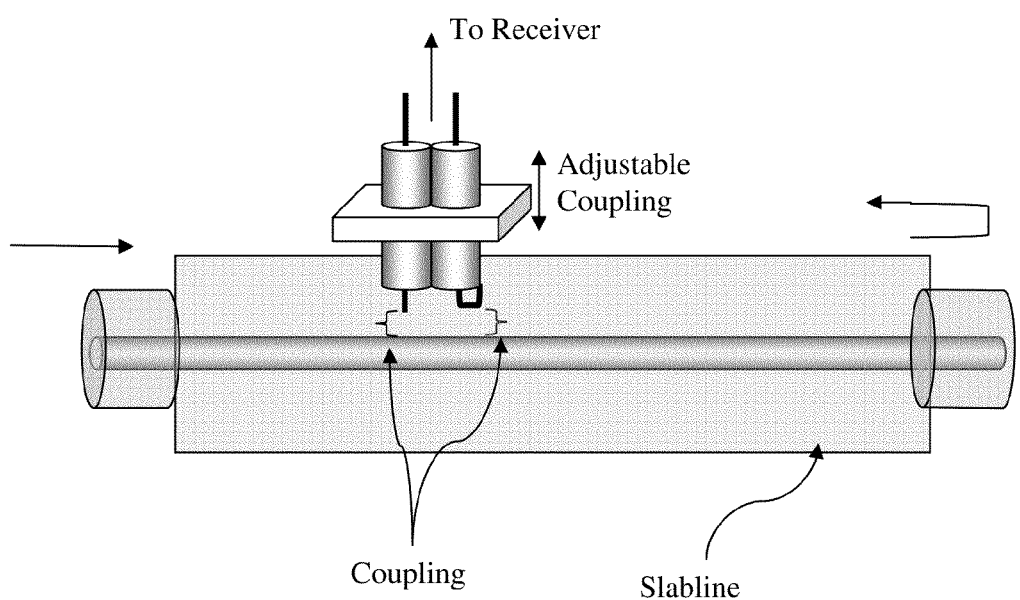
Figure 6: Adjustable IV sensor assembly.

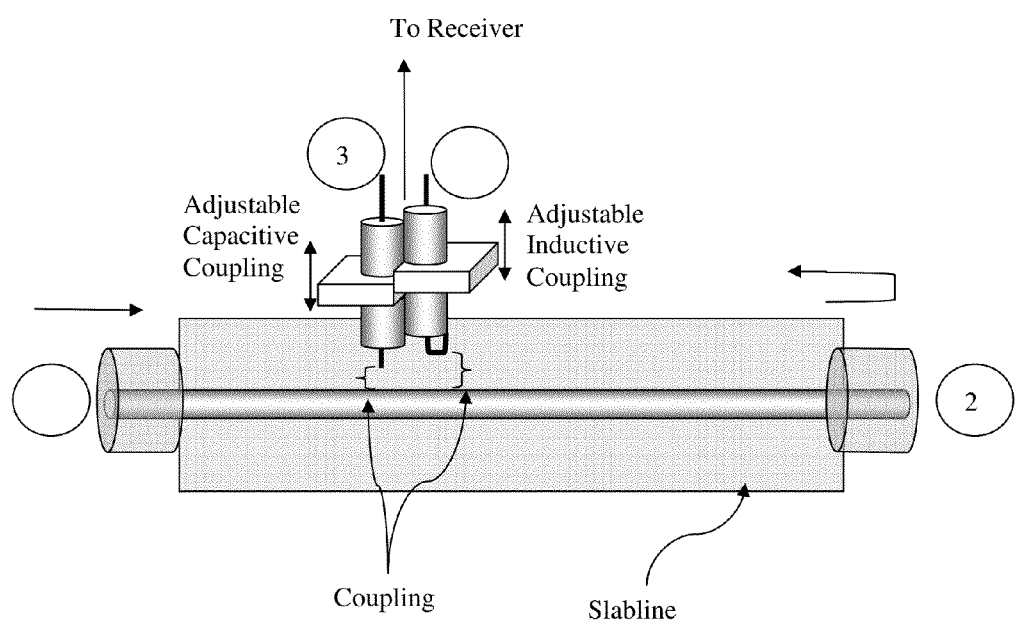
Figure 7: IV sensor assembly with separate adjustability.

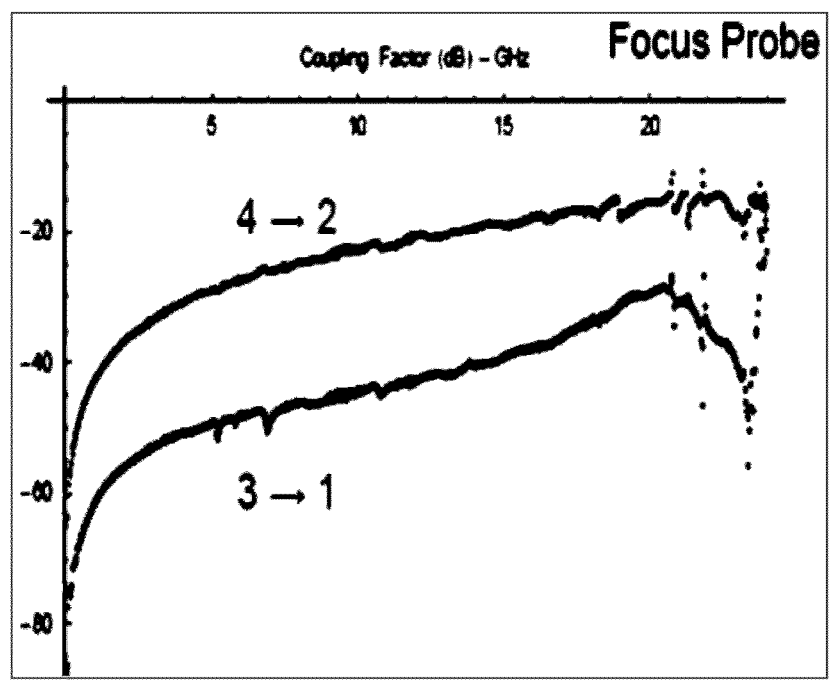
Figure 8: Prior art, coupling factor of capacitive and inductive sensors.

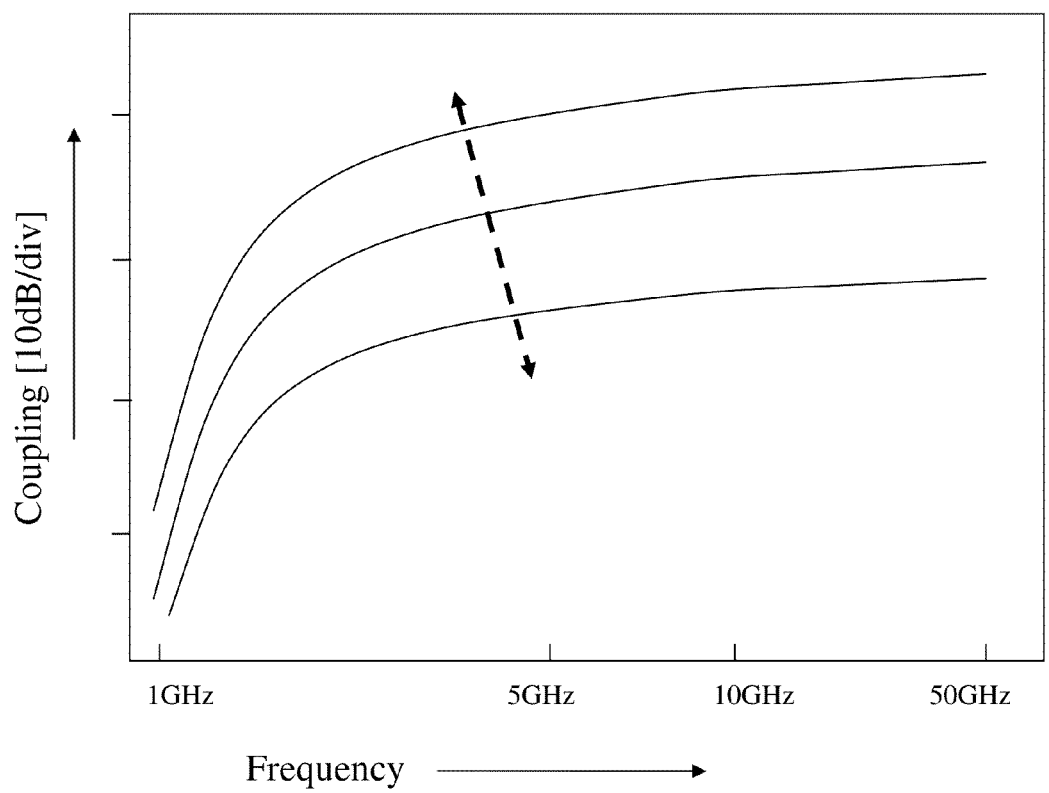
Figure 9: Adjusting the coupling factor of capacitive and inductive sensors.

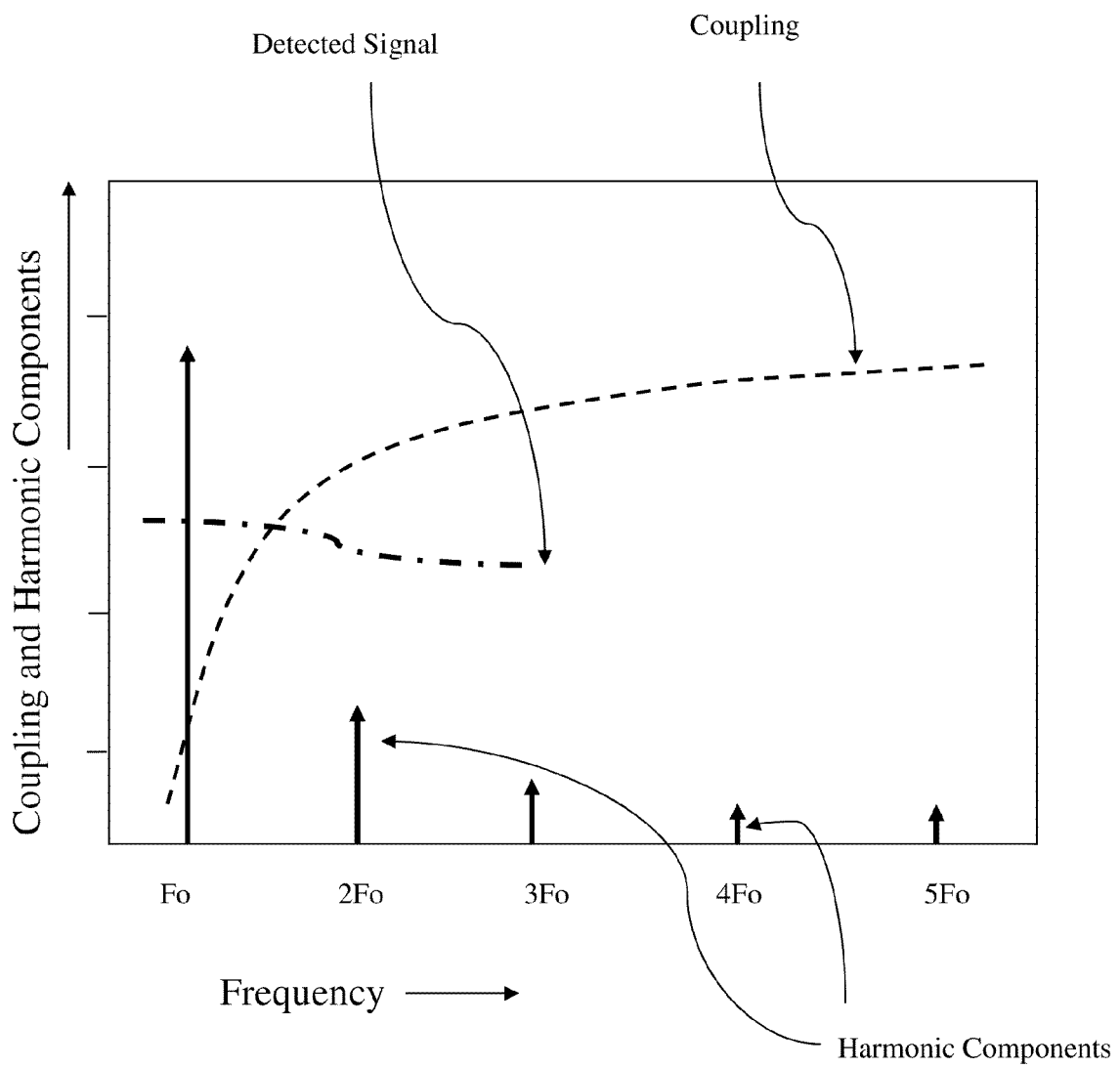
Figure 10: Prior art, effect of increasing coupling on detected harmonic signals.

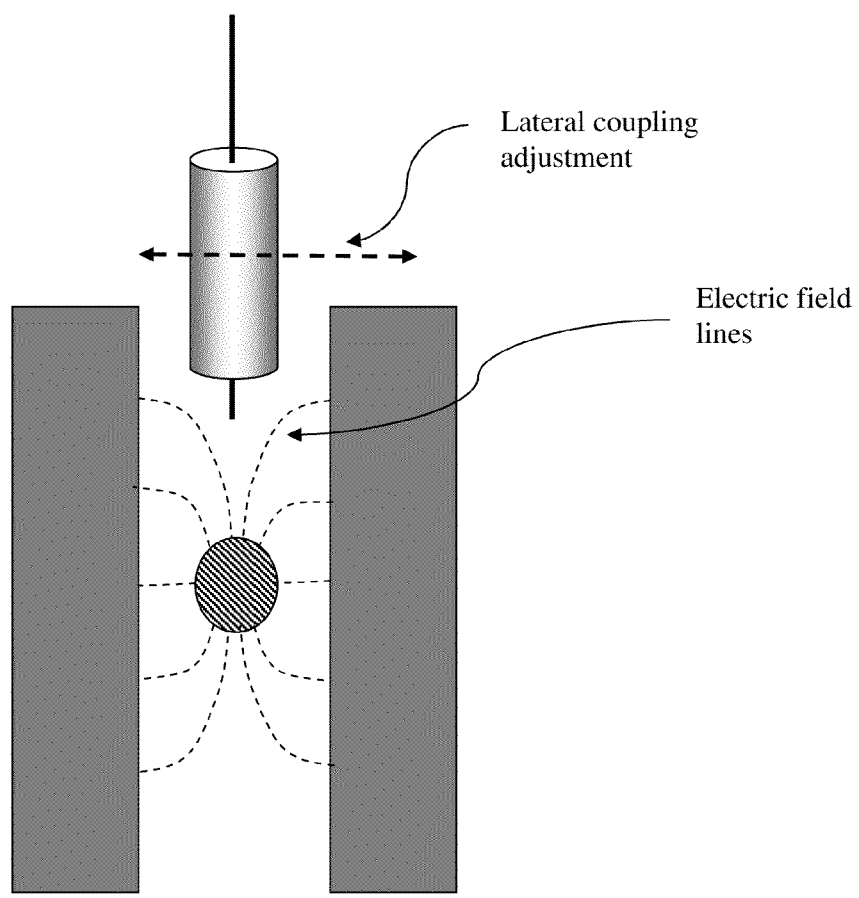
Figure 11: Adjusting electric/capacitive coupling via lateral sensor displacement.

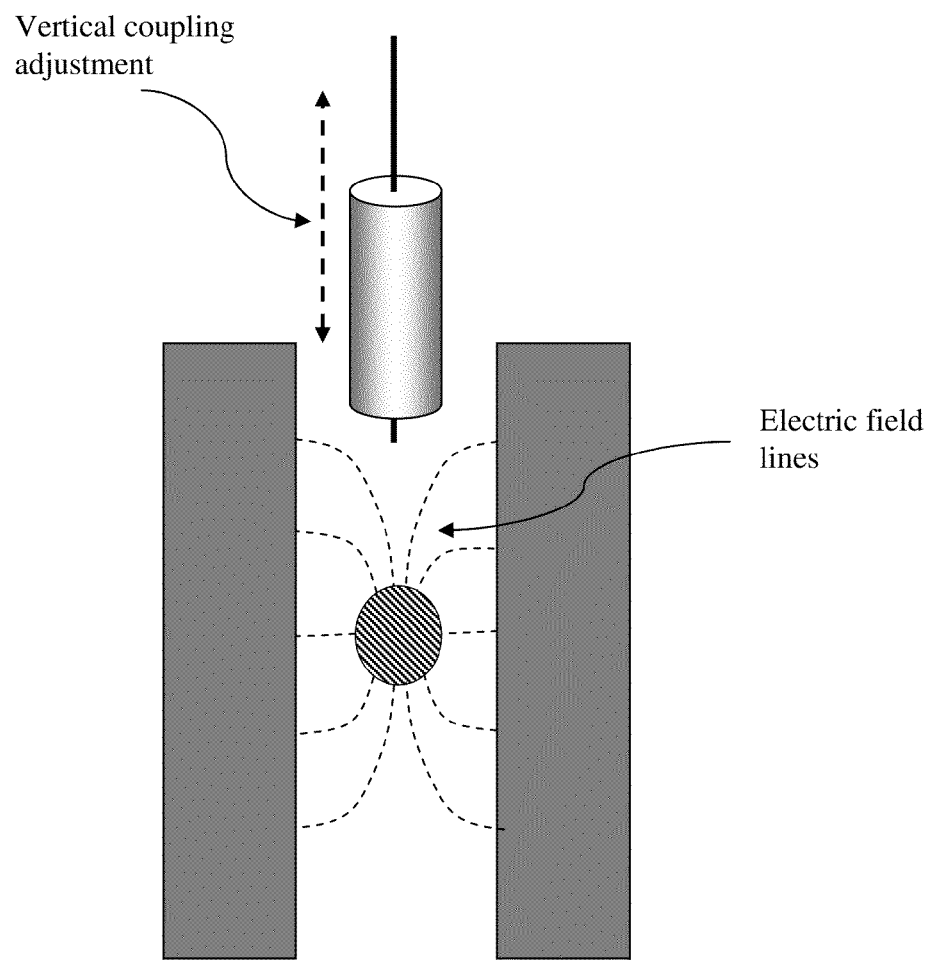
Figure 12: Adjusting capacitive coupling via vertical sensor displacement.

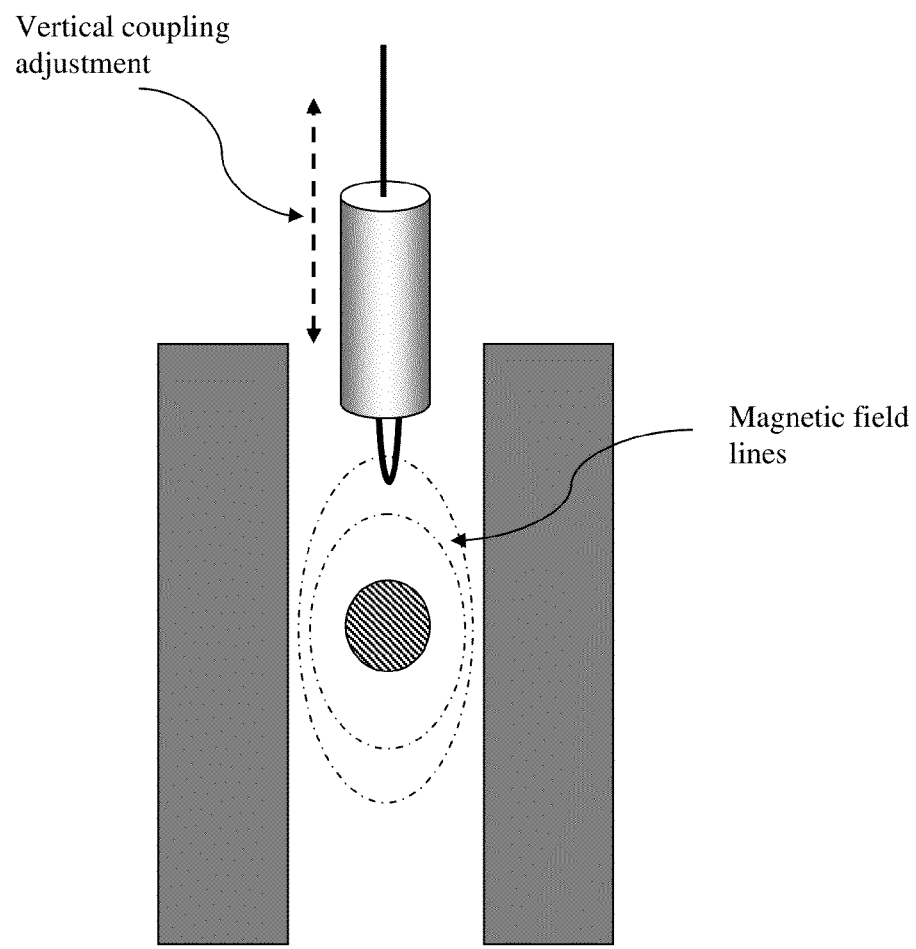
Figure 13: Adjusting inductive coupling via vertical sensor displacement.

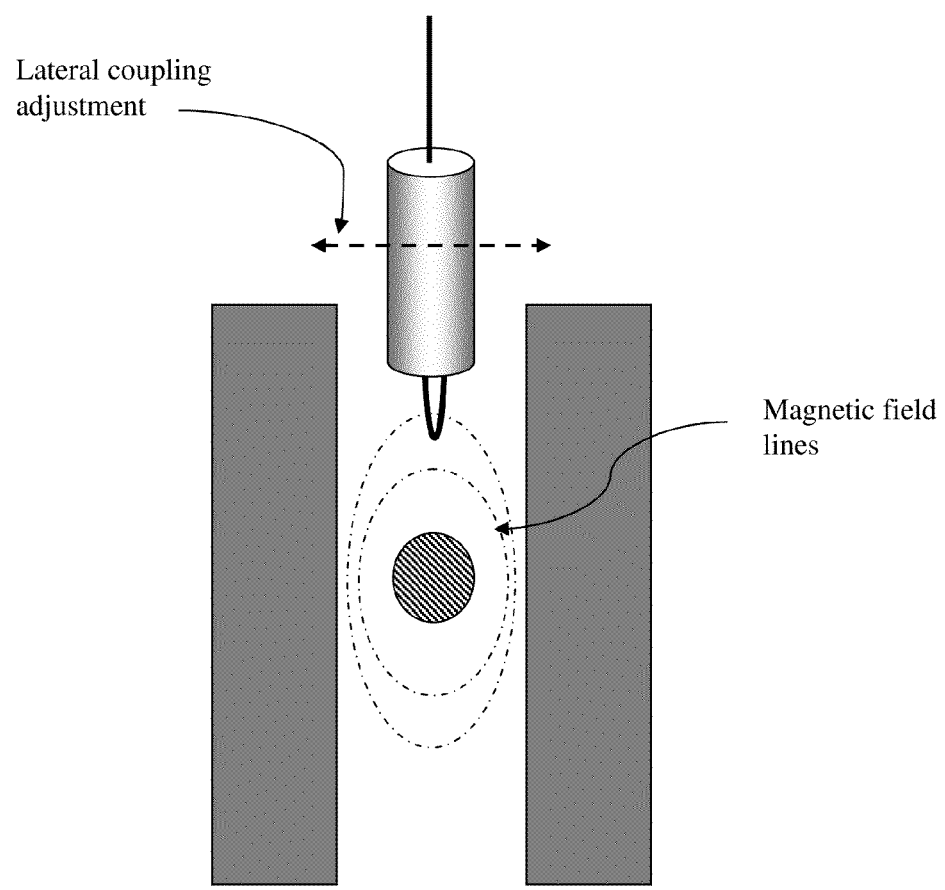
Figure 14: Adjusting inductive coupling via lateral sensor displacement.

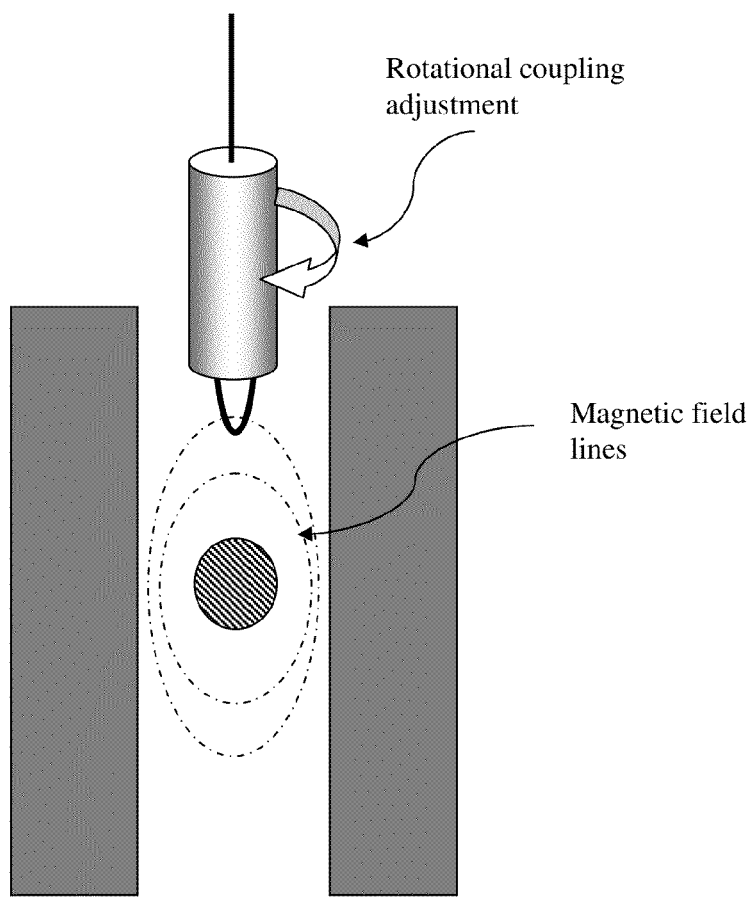
Figure 15: Adjusting inductive coupling via rotational sensor displacement.

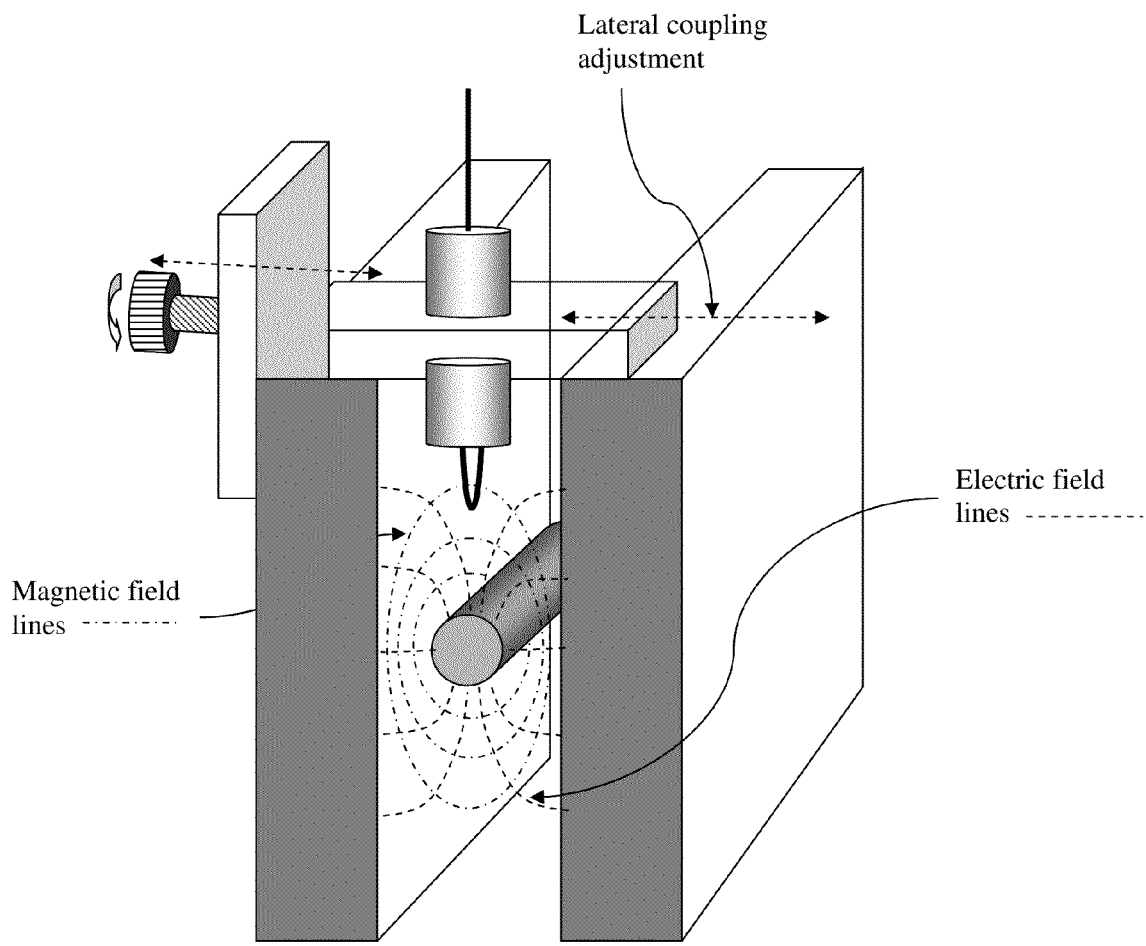
Figure 16: Adjusting inductive coupling via lateral sensor displacement.

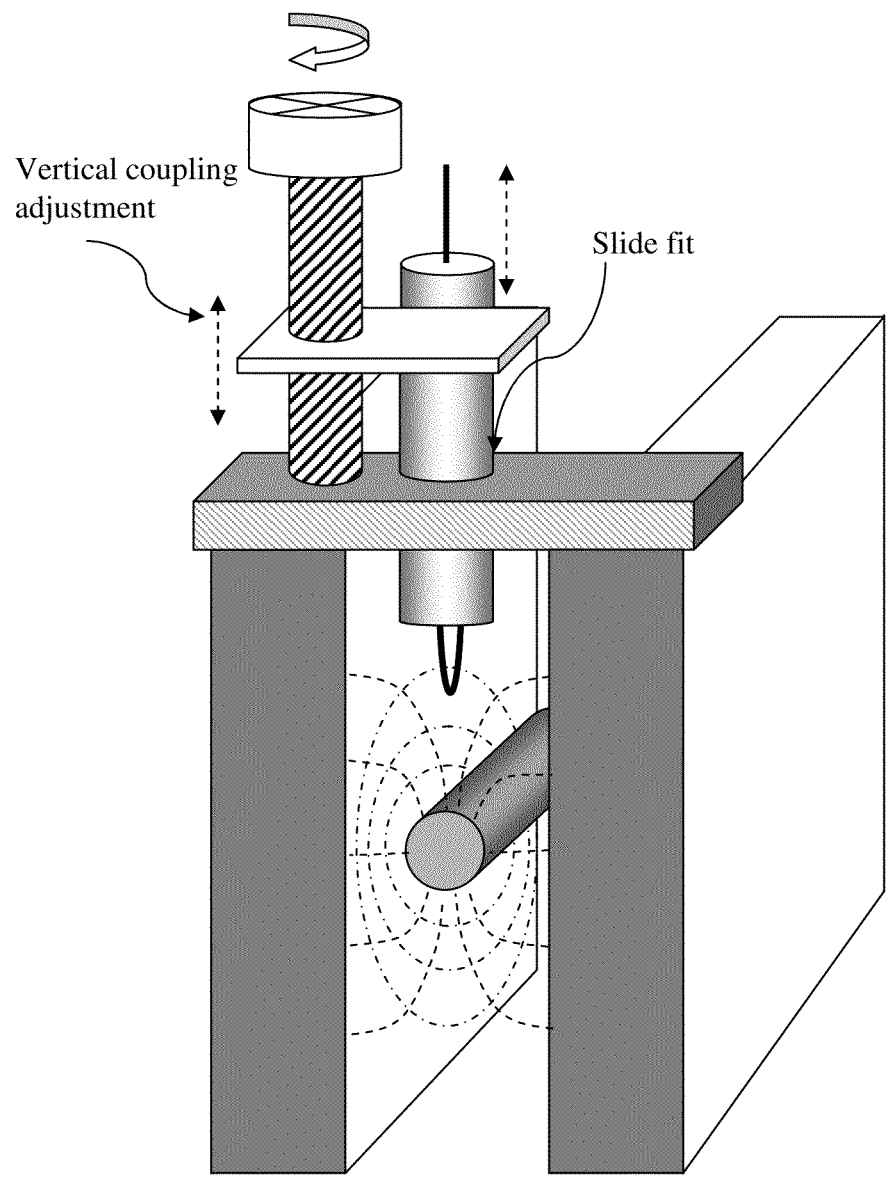
Figure 17: Adjusting inductive coupling via vertical sensor displacement.

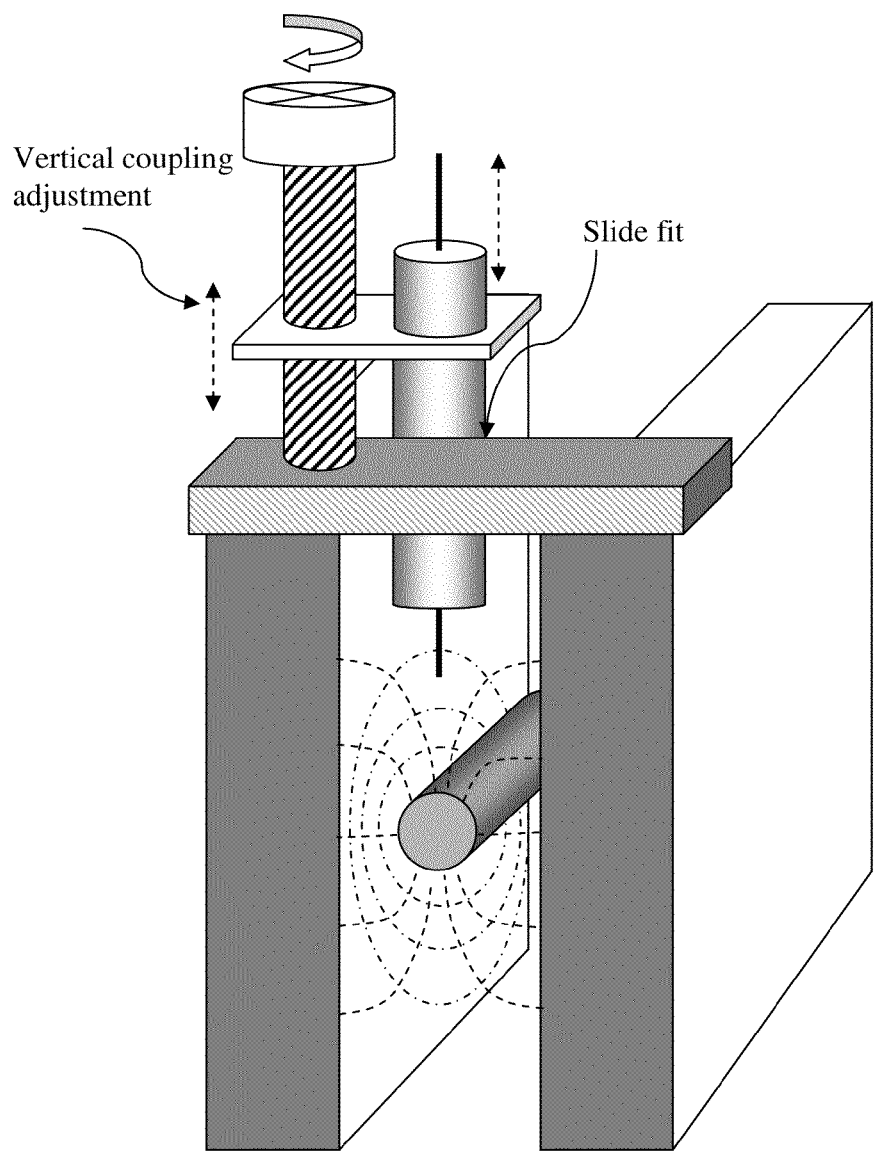
Figure 18: Adjusting capacitive coupling via vertical sensor displacement.

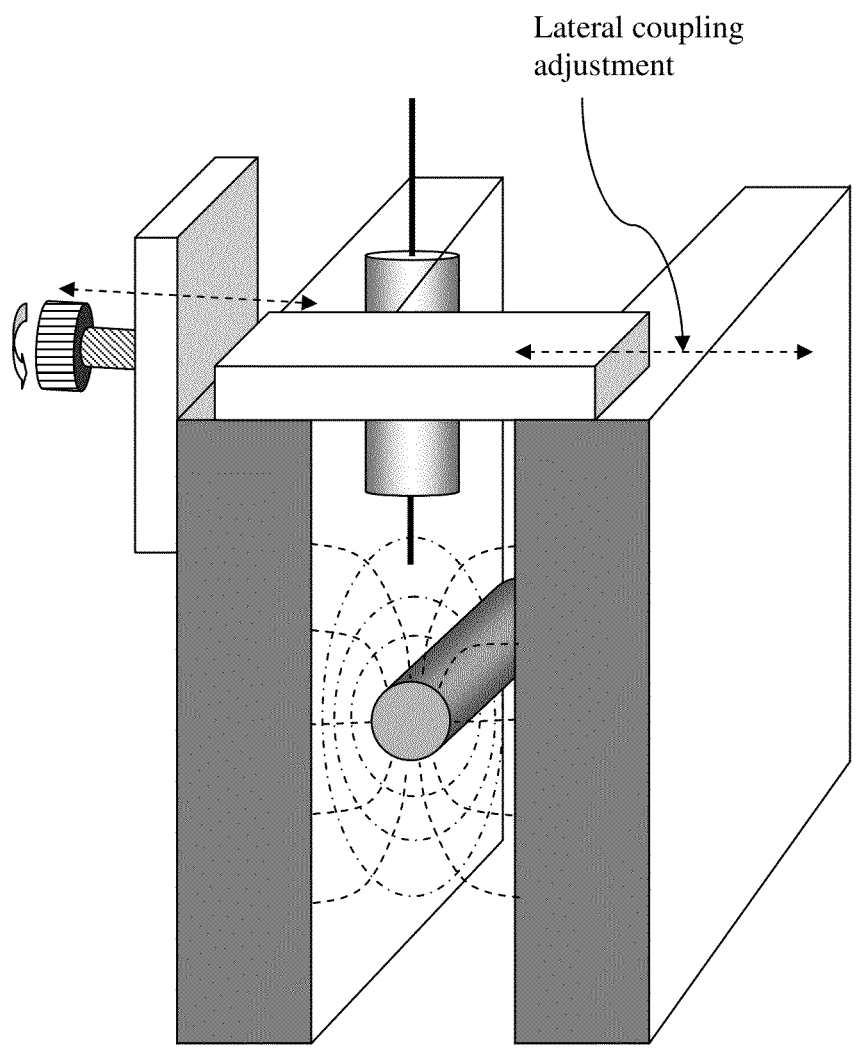
Figure 19: Adjusting capacitive coupling via lateral sensor displacement.

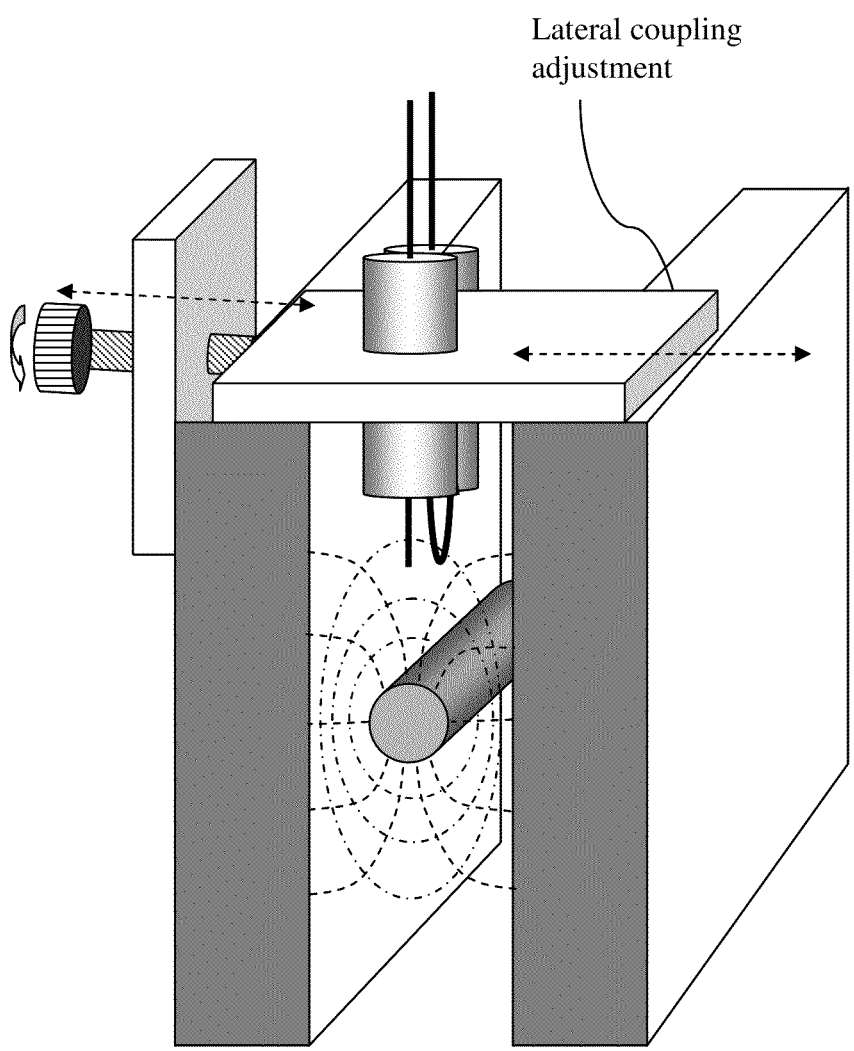
Figure 20: Adjusting total coupling via lateral sensor displacement.

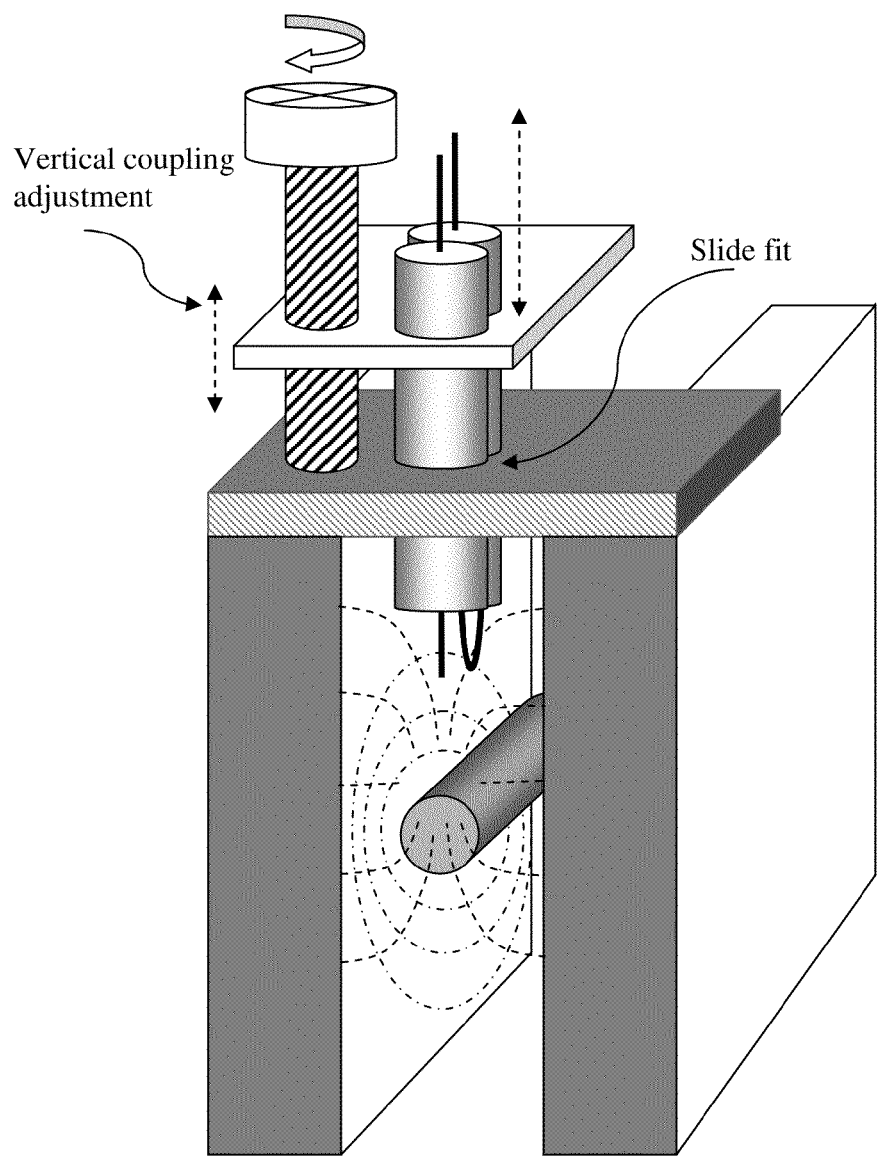
Figure 21: Adjusting total coupling via vertical sensor displacement.

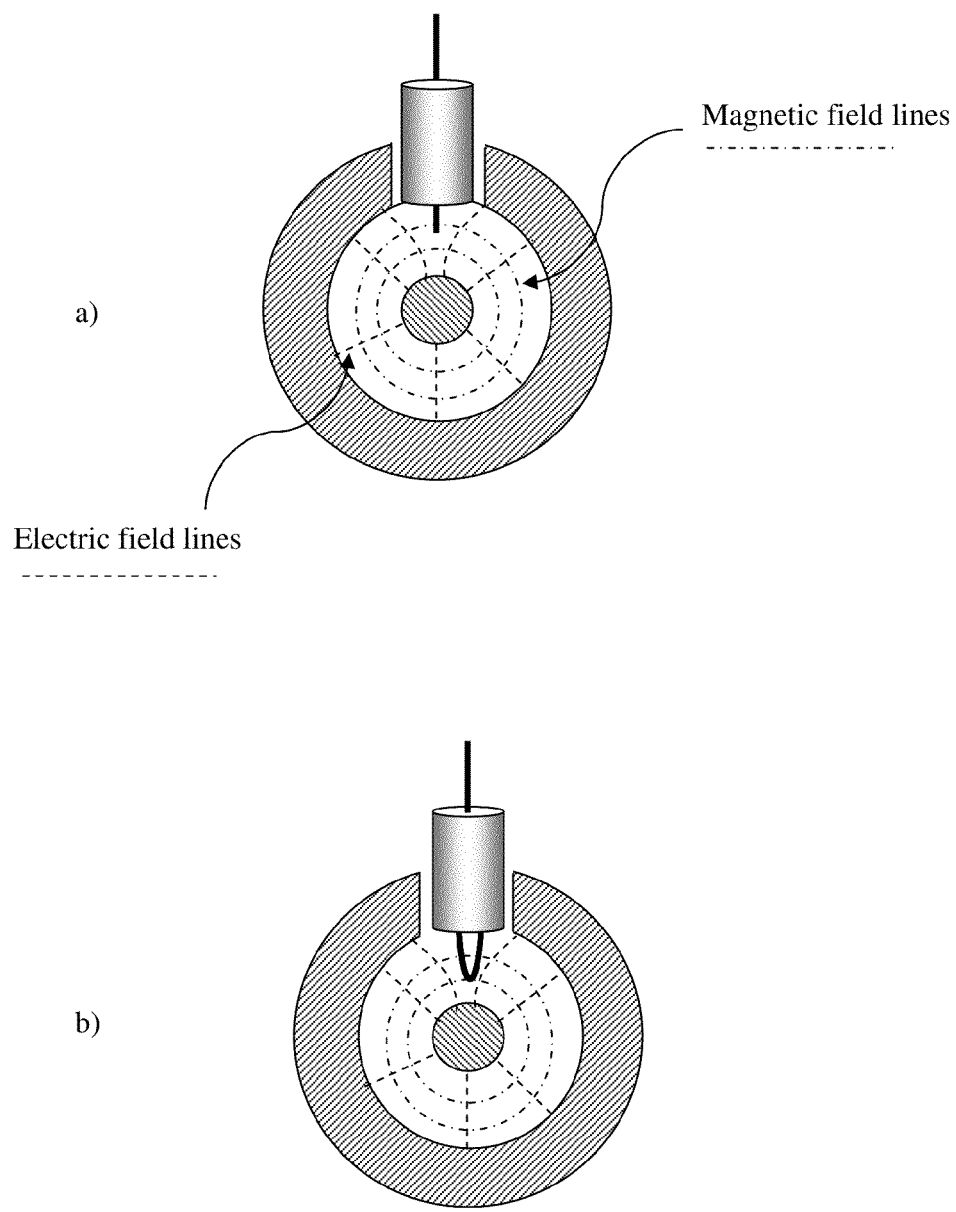
Figure 22: Capacitive (a) and inductive (b) sensors in a slotted coaxial airline.

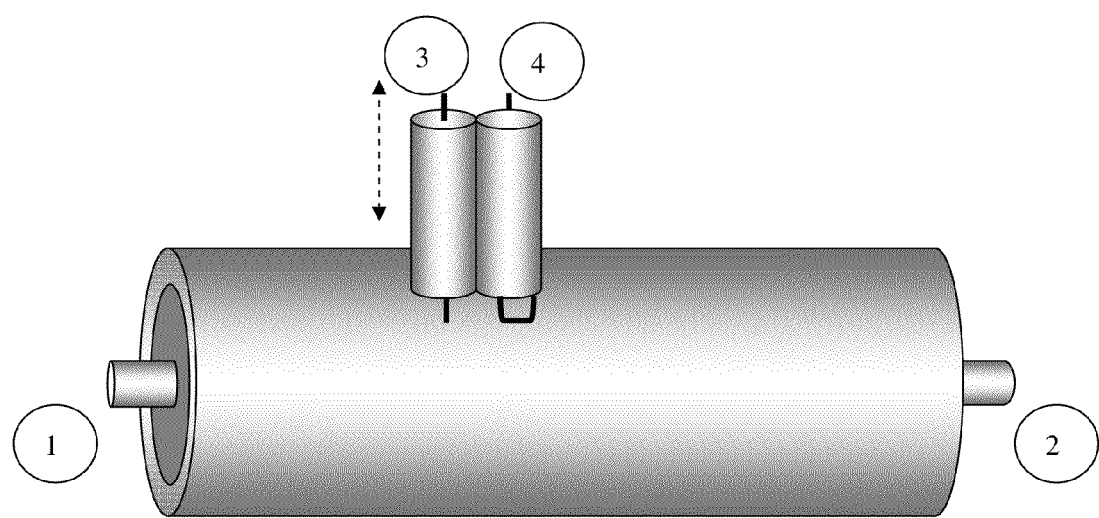
Figure 23: Capacitive and inductive sensor assembly in a slotted coaxial airline.

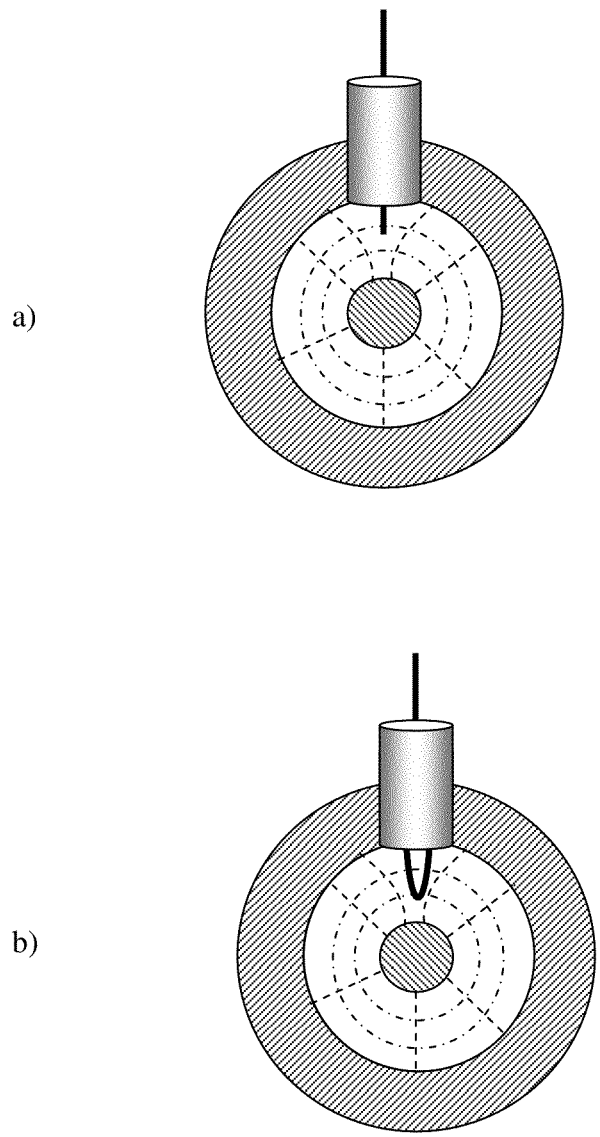
Figure 24: Capacitive (a) and inductive (b) sensors in a slotted coaxial airline.

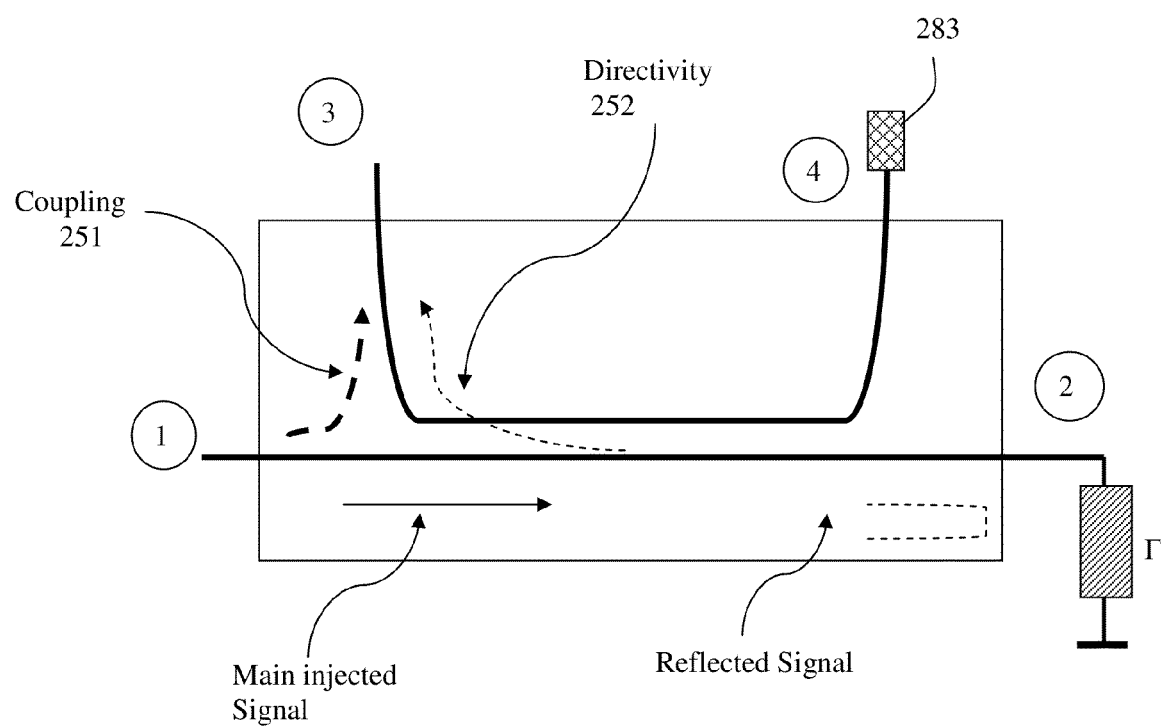
Figure 25: Prior art, signal propagation in a directional coupler.

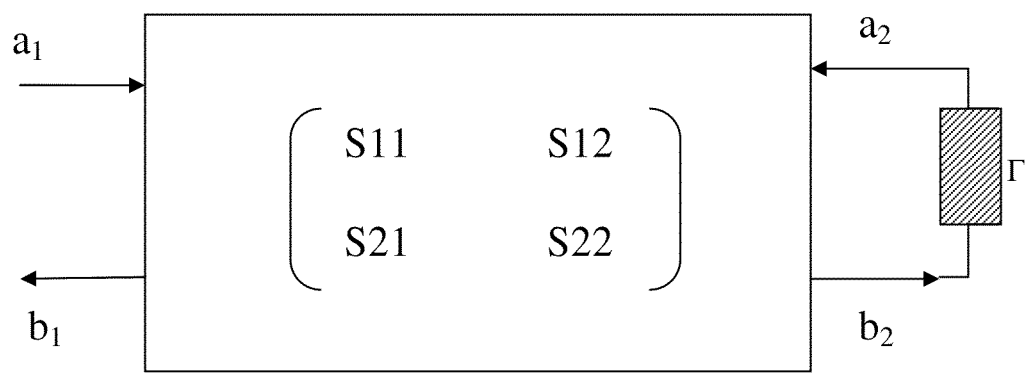
Figure 26: Prior art, definition of two-port S-parameters.

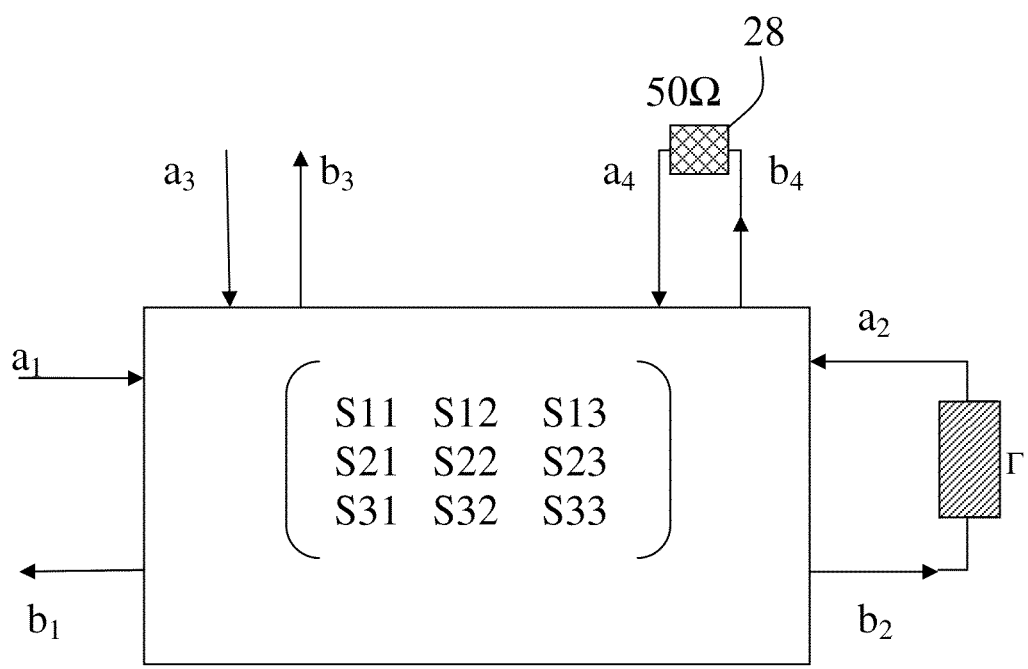
Figure 27: Prior art, definition of bi-directional coupler S-parameters

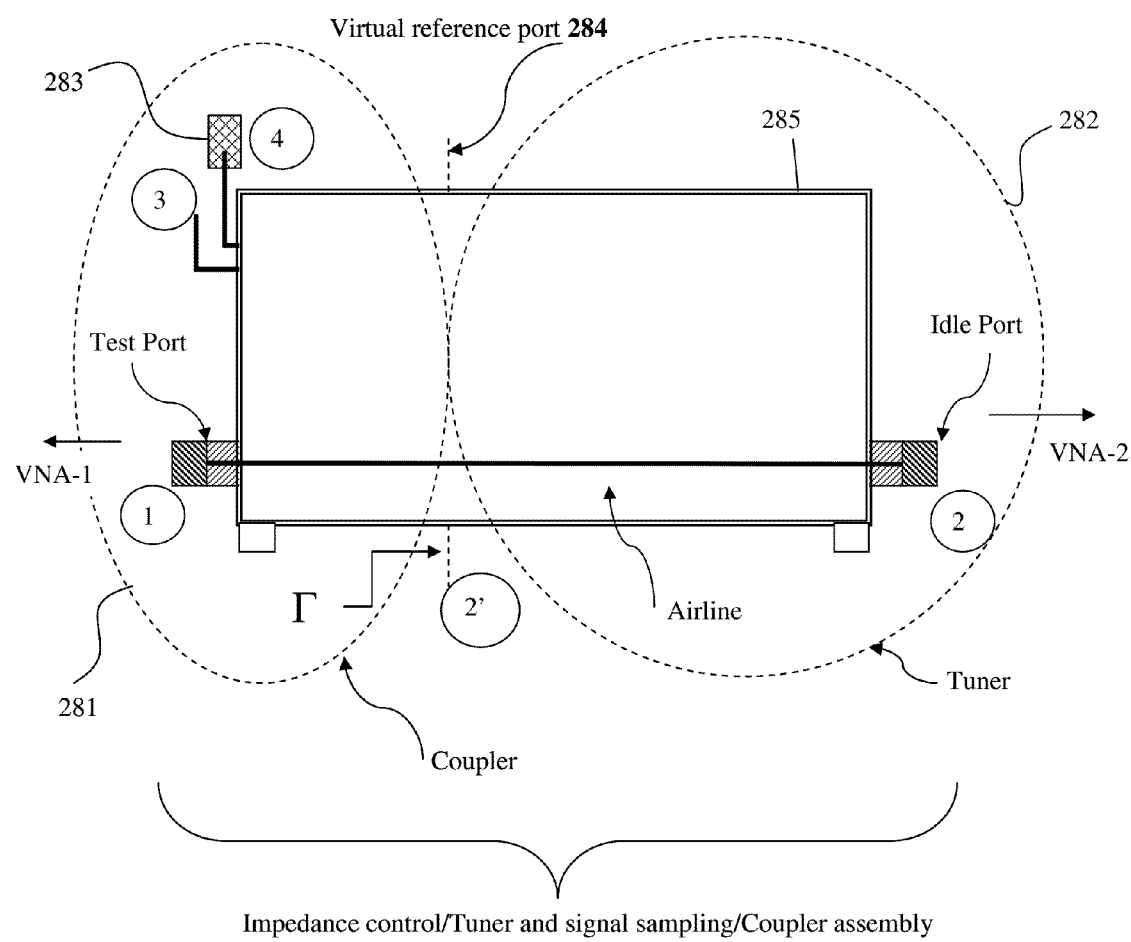
Figure 28: Reference planes for Calibration method using single probe tuner.

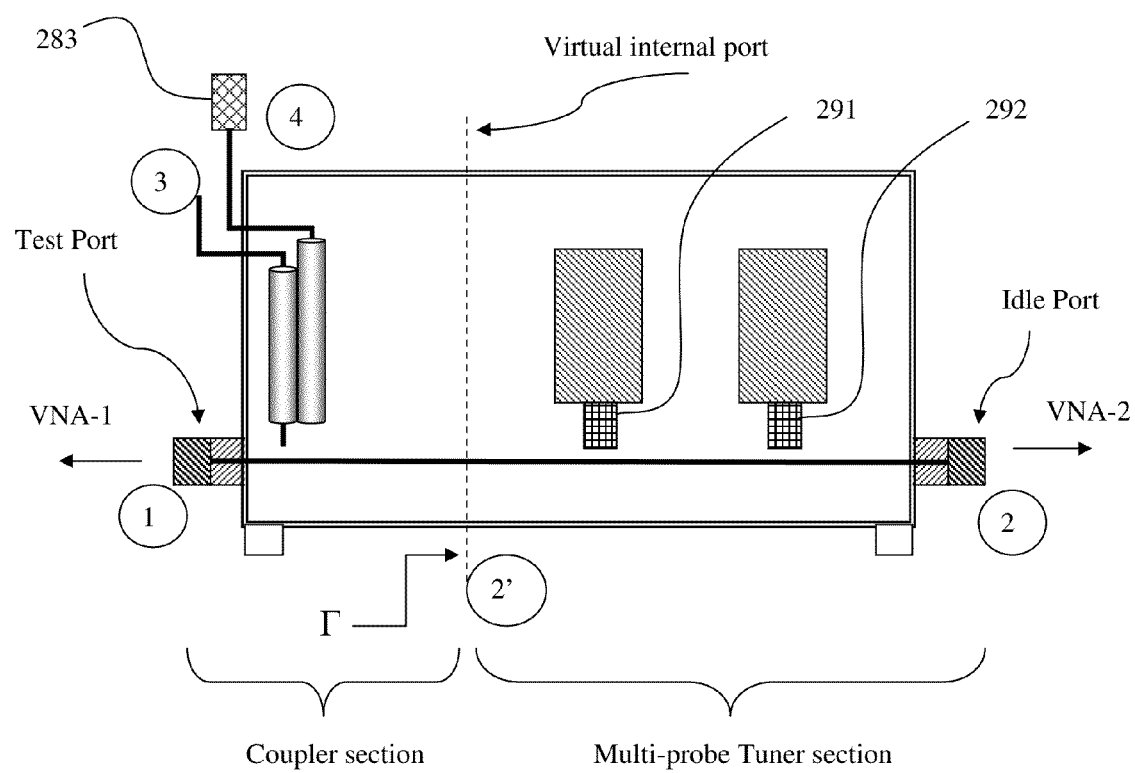
Figure 29: Reference planes for Calibration method using multi-probe tuner.

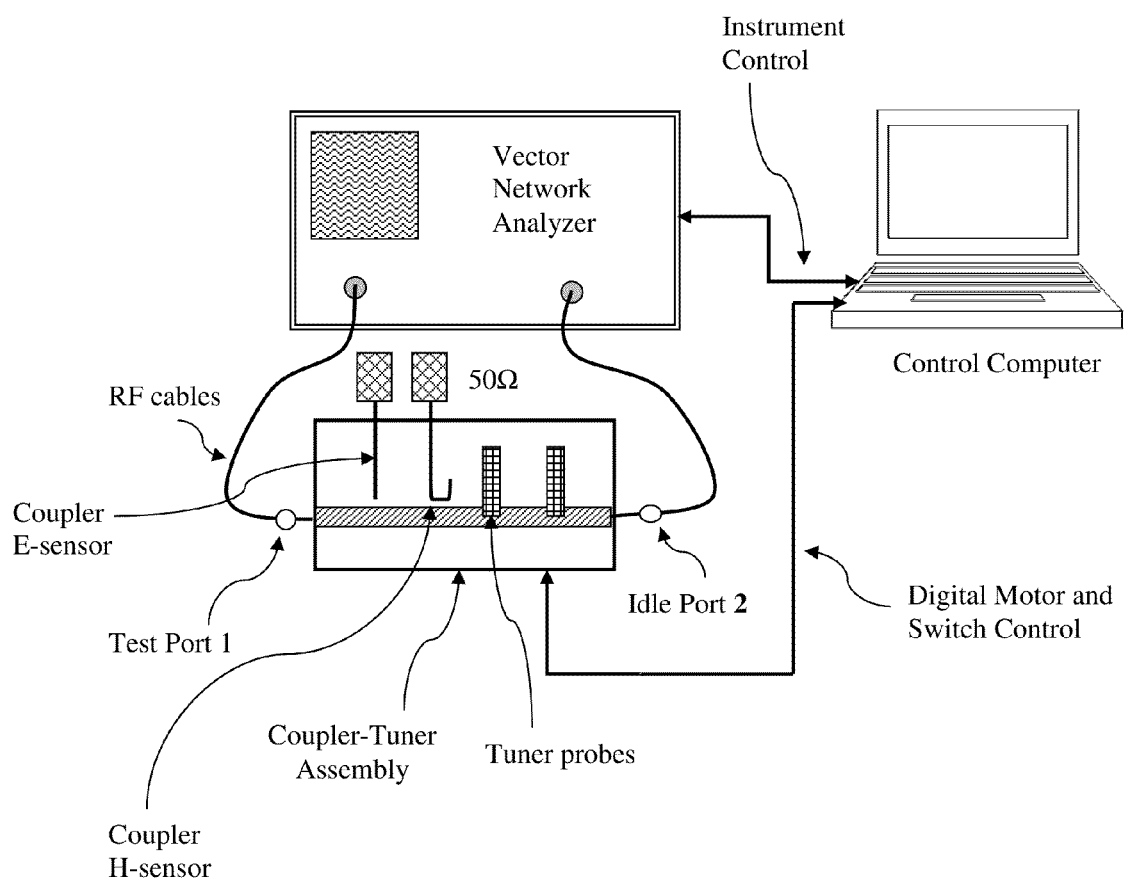
Figure 30: Setup for calibrating the Tuner in the Coupler-Tuner assembly.

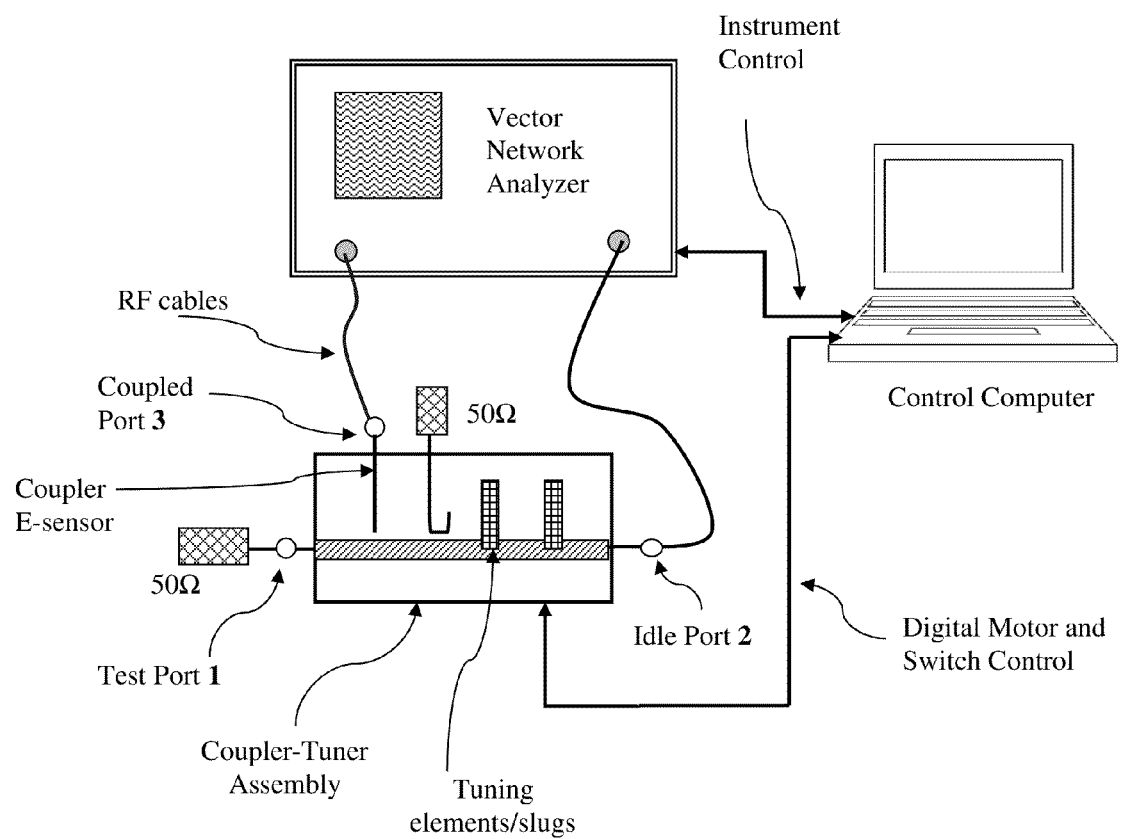
Figure 31: Setup for calibrating the Coupler from port 3 to port 2 in the Coupler-Tuner assembly.

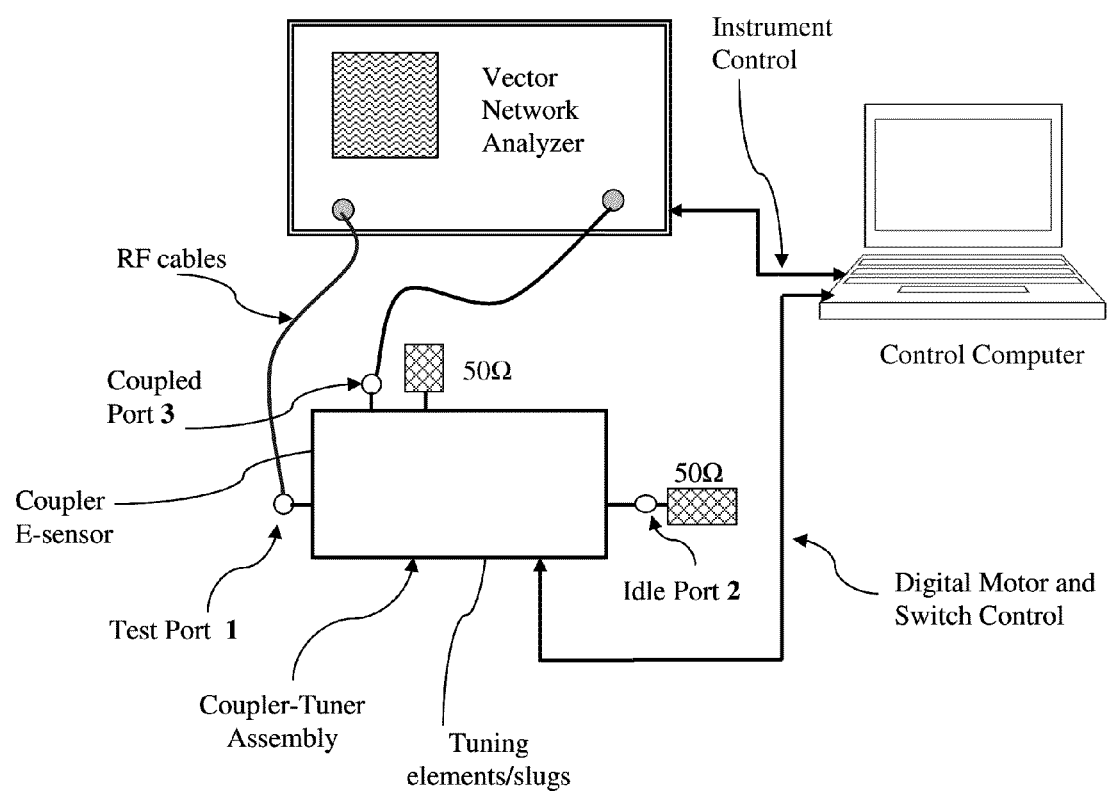
Figure 32: Setup for calibrating the Coupler from port 1 to port 3 in the Coupler-Tuner assembly.

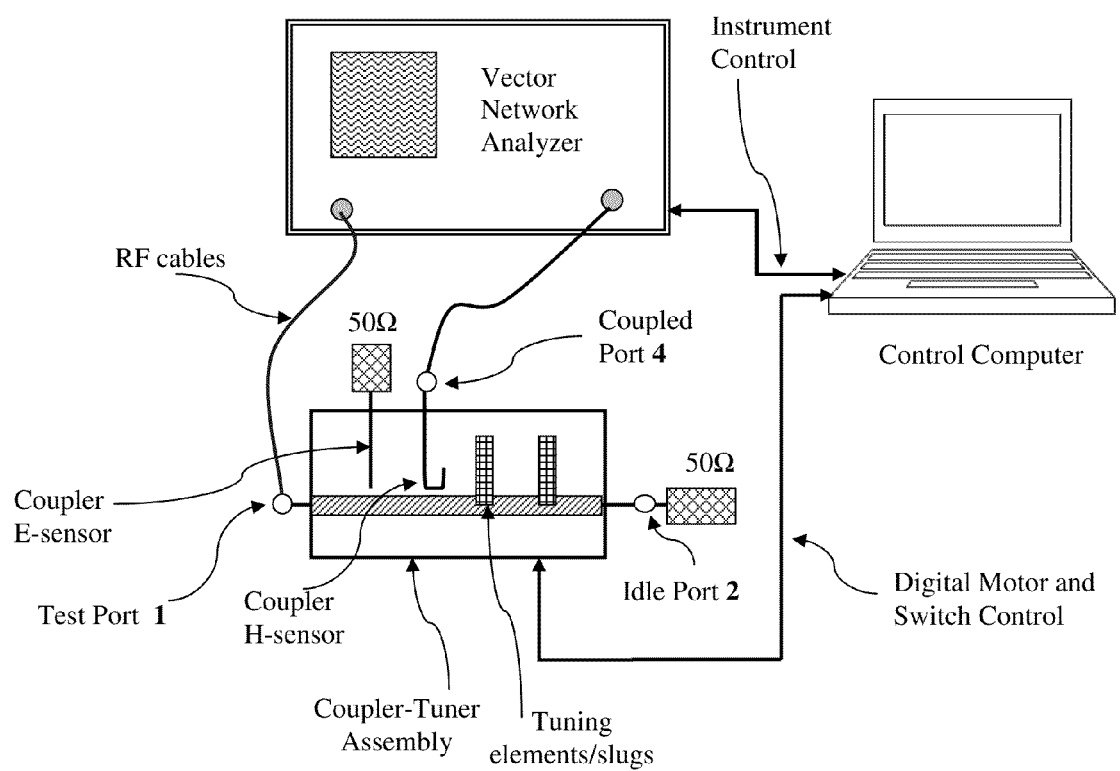
Figure 33: Setup for calibrating the Coupler from port 1 to port 4 in the Coupler-Tuner assembly.

ADJUSTABLE SIGNAL SAMPLING SENSOR AND METHOD

PRIORITY CLAIM

Not Applicable

CROSS-REFERENCE TO RELATED ARTICLES

[1] Directional Couplers, Microwave Encyclopedia, http://www.microwaves101.com/encyclopedia/directionalcouplers.cfm
[2] SISCHKA, Franz, "Basics of S-Parameters, part 1", Characterization handbook, March 2002.
[3] SIMPSON, G, Signal measurement systems and methods, U.S. Pat. No. 7,548,069.
[4] STENARSON, J. and YHLAND K., IEEE Transactions on Microwave Theory and Techniques, Vol 49, No 12, December 2001, pages 2567-2572.
[5] YHLAND K, STENARSON J., European Patent Application, EP 1 316 806.
[6] TSIRONIS, C, U.S. Pat. No. 6,674,293, "Adaptable Pre-matched Tuner System and Method".
[7] TUCKER, R. S. and BRADLEY P., "Computer-Aided Error Correction of Large-Signal Load-Pull Measurements", IEEE Transactions on Microwave Theory and Techniques, vol. MTT-32, No. 3, March 1984, p. 296-300.
[8] Fourier Transformation, http://en.wikipedia.org/wiki/Fourier transform.
[9] "MPT, a Universal Multi-Purpose Tuner, Product Note 79", Focus Microwaves Inc., October 2004, www.focus-microwaves.com.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to high power (nonlinear) testing of microwave transistors (DUT) in the frequency and time domain. When said transistor is driven in its nonlinear operation regime, a sinusoidal input electrical signal is deformed and the output signal contains harmonic components, following Fourier's analysis of periodic non-sinusoidal quantities. The electrical signals injected at the input of the DUT and extracted at the output can be sampled using signal sampling devices, such as signal couplers [1], wave-probes [5] or IV probes [3] and processed by appropriate signal analyzers [7].

DESCRIPTION OF PRIOR ART

A typical test setup allowing sampling electrical signals at the input and output of a DUT in nonlinear operation regime is shown in FIG. 1. In this setup the source and load impedances are nominally 50Ω (the standard characteristic impedance of microwave transmission lines today). Other characteristic impedances can be used, such as 75Ω; the important element here is that the source and load impedances are wideband and constant over the frequency range. The input and output signal couplers extract a small portion of the RF power waves a(t) and b(t) which are injected and extracted from the DUT and apply them into the tuned signal receiver, which measures the fundamental and the harmonic components of it and may display the time function, using inverse Fourier transformation [8]. This is necessary because high frequency (microwave) receivers are easier to manufacture in form of "tuned" harmonic receivers than "real time" receivers.

Another, also common, test setup for the DUT testing is shown in FIG. 2: this setup provides additionally for source and/or load impedance control at the fundamental frequency Fo and, when appropriate "harmonic impedance tuners" [9] are used, also for controlling the harmonic impedances at 2Fo, 3Fo etc. The tuners are used to synthesize and optimize the DUT's performance for certain criteria, such as output power, gain, power added efficiency, linearity etc.

From FIGS. 1 and 2 it follows that the level of power to measure at the harmonic receiver varies significantly depending on the DUT type and the operating power level, or gain compression level. The signal receivers themselves have a "dynamic range"; that is an input power range where their readings are calibrated and correct. If this range is exceeded, either above a certain level, or below, the readings are wrong. For each type of DUT and one range of DUT power, this power balance can be adjusted using attenuators inserted into the cable between coupler and receiver (FIGS. 1, 2); but this requires disassembling of the setup. A simpler method would be to use "adjustable" couplers. However such components do not exist. Such adjustable signal detectors are disclosed in this invention. They are a significant improvement to known "fixed coupling" Capacitive-Inductive signal probes [3, 4] or "IV probes".

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a signal measurement system using signal probing.
FIG. 2 depicts prior art, a signal measurement system using signal probing and impedance tuners.
FIG. 3 depicts prior art [4], the concept of IV sensor/probe.
FIG. 4 depicts prior art [3], an IV sensor/probe setup.
FIG. 5 depicts prior art [1], [2], a fixed IV sensor assembly.
FIG. 6 depicts an adjustable IV sensor assembly.
FIG. 7 depicts an IV sensor assembly with separate adjustability.
FIG. 8 depicts prior art, the coupling factor of capacitive and inductive sensors.
FIG. 9 depicts the method of adjusting the coupling factor of capacitive and inductive sensors.
FIG. 10 depicts prior art, the effect of increasing coupling on detected harmonic signals.
FIG. 11 depicts the principle of adjusting electric/capacitive coupling via lateral sensor displacement.
FIG. 12 depicts the principle of adjusting capacitive coupling via vertical sensor displacement.
FIG. 13 depicts the principle of adjusting inductive coupling via vertical sensor displacement.
FIG. 14 depicts the principle of adjusting inductive coupling via lateral sensor displacement.
FIG. 15 depicts the method of adjusting inductive coupling via rotational sensor displacement.

FIG. 16 depicts the method of adjusting inductive coupling via lateral sensor displacement.

FIG. 17 depicts the method of adjusting inductive coupling via vertical sensor displacement.

FIG. 18 depicts the method of adjusting capacitive coupling via vertical sensor displacement.

FIG. 19 depicts the method of adjusting capacitive coupling via lateral sensor displacement.

FIG. 20 depicts the method of adjusting total coupling via lateral sensor displacement.

FIG. 21 depicts the method of adjusting total coupling via vertical sensor displacement.

FIG. 22 depicts capacitive and inductive sensors in a slotted coaxial airline.

FIG. 23 depicts capacitive and inductive sensor assembly in a slotted coaxial airline.

FIG. 24 depicts capacitive and inductive sensors in a slotted coaxial airline.

FIG. 25 depicts prior art, signal propagation in a directional coupler.

FIG. 26 depicts prior art, the definition of two-port S-parameters.

FIG. 27 depicts prior art, the definition of bi-directional coupler S-parameters.

FIG. 28 depicts the reference planes for a calibration method using a single probe tuner.

FIG. 29 depicts the reference planes for a calibration method using multi-probe tuner.

FIG. 30 depicts the setup for calibrating the tuner in the coupler-tuner assembly.

FIG. 31 depicts the setup for calibrating the coupler from port 3 to port 2 in the coupler-tuner assembly.

FIG. 32 depicts the setup for calibrating the coupler from port 1 to port 3 in the coupler-tuner assembly.

FIG. 33 depicts the setup for calibrating the coupler from port 1 to port 4 in the coupler-tuner assembly.

DETAILED DESCRIPTION OF THE INVENTION

Capacitive/Inductive (VI or IV) signal detection sensors have been disclosed and used before [1, 2], FIGS. 3, 4 and 5. In all cases said IV probes lack an element of adjustability. If the power generated by the DUT is too high to be tolerated and measured accurately by the receiver, then the only actually available approach is to insert attenuators in line with the signal from the probe to the receiver FIGS. 1, 2.

If the signal generated by the DUT is too low for the receiver sensitivity then a different coupler/sensor must be selected and the setup must be disassembled, re-assembled and re-calibrated. There is no known prior art showing in-situ increasing or decreasing the coupling factor of signal sampling IV sensors.

FIGS. 6 and 7 demonstrate the principle of adjusting the coupling of signal sensors, FIGS. 11 to 15 explain the concept, and FIGS. 16 to 21 show simple mechanisms for adjusting the coupling of the sensors. They comprise a vertical or lateral displacement of the sensor heads inside the slot of the airline. As is shown in FIGS. 6, 7 and 11 to 15 the signal portion detected by said sensor depends on the actual immersion of the capacitive antenna sensor into the electric field and the amount of magnetic field captured by the inductive loop sensor. This can be made either by inserting said sensors together or individually deeper into the slot of the airline (or closer to the center conductor, where both, the magnetic and electric fields are stronger) or moving them towards the walls of said slot or even rotating the magnetic loop, in order to change its effective cross section profile relative to the magnetic field lines.

In FIG. 6 both capacitive and inductive sensors are adjustable simultaneously. A simple mechanism, shown in FIG. 21, illustrates how this can be done: both sensors are assembled and attached to a vertical screw, which defines the distance of said sensors from the center conductor and thus the coupling to the signal in the airline. Similar constructions are shown in FIGS. 16 to 21, allowing the sensors to be moved vertically into the slot of the airline or laterally in areas where the electric or magnetic fields are weaker; the magnetic loop can also be rotated in itself (FIG. 15) in order to capture more or less magnetic field energy and vary this way the effective magnetic coupling.

FIG. 8 shows the signal coupling factor between the various ports of said signal coupling device as a function of frequency. It shows that magnetic coupling is weaker than electric coupling (in this case) and shall be adjusted. It also shows that the coupling factor itself increases with increasing frequency. This is a beneficial behavior as will be explained later. FIG. 9 shows how the coupling factor of either the electric coupling or the magnetic coupling can be adjusted by changing the mechanical position of either sensor inside the slotted airline of the signal coupler. FIG. 10 illustrates why the frequency dependence of the coupling factor, shown in FIGS. 8 and 9 is beneficial for the present application. It shows that said signal coupler will detect stronger at higher frequencies and, incidentally, the harmonic components of any distorted signal are typically weaker than the fundamental component. This means that the present signal coupler will provide higher sensitivity for the weaker harmonic signal components and lower sensitivity for the stronger fundamental signal, resulting in a better balanced overall sensitivity of the system and allows for a higher dynamic range operation of the signal receiver.

It is well known that in signal couplers, either distributed ones or IV sensor based ones (like in this invention) the coupled signal comes from both the input port 1 and the output port 2 (FIG. 25). The signal portion detected at the coupled port 3 is composed of the (desired) directly coupled part (251), coming from the input port 1, and the (undesired) leakage part (252), and coming from the output port 2. The difference (in dB) of the coupled signal part (251) to the leaked signal part (252) is called "Directivity" of the coupler [1]. S-parameters [2] describe fully the behavior of the coupler and its coupling factor CF between port 1 and port 3 as long as the load on port 2 is set to $\Gamma=0$ (or $Z=50\Omega$). Then the coupling factor "CF" is equal to S31. But if the load at port 2 is different than $50\Omega$ (or $\Gamma \neq 0$), then some part of the traversing main signal will be reflected at port 2 and will leak (through the Directivity) to port 3. Thus the effective coupling factor CF will change, and, for accurate measurements, it must be corrected. Port 4 of the coupler is inactive and irrelevant for this analysis and is supposed to be terminated with the system characteristic impedance $Z=50\Omega$.

Assuming that port 4 of the signal-coupler four-port is terminated with $50\Omega$ and is idle/inactive, said signal-coupler can be considered as a three-port device comprising ports 1 (input port), port 2 (output port) and port 3 (coupled port); in this case the S-parameters of the coupler are Sij for {i,j}={1, 3}, FIG. 27; the generalized parameters (C-parameters, "C" stands for "Coupler") equations describing the coupling behavior between ports 1 and 3, of the actual coupler, when port 2 is terminated with Γ≠0, (Z≠50Ω), are as follows:

a. $C11 = S11 + (S12*S21*\Gamma)/(1-S22*\Gamma)$  (eq (1)).

b. $C22 \approx S22; C33 \approx S33$  (eq (2)).

c. $CF = C13 = C31 = S31 + (S32*S21*\Gamma)/(1-S22*)$  (eq (3)).

Hereby C11, C22, C33 describe the reflection factors looking into the Coupler at ports 1, 2 and 3, and CF=C13=C31 describes the effective coupling factor between port 1 and port 3 (when Γ≠0). Above equations (1) to (3) are derived as follows: as shown in FIG. 25 S-parameters describe the behavior of linear RF two-ports in an effective way; in the case of said coupler, which is a passive reciprocal two-port all S-parameters also fulfill Sji=Sji; for i≠j; and b1=S11*a1+ S12*a2 (eq 4); b2=S21*a1+S22*a2 (eq 5);

$$\Gamma = \frac{a2}{b2};$$  (eq 6)

by substituting equation (6) into equations (4) and (5) we obtain the known relationship:

$$\frac{b1}{a1} = S11 + \frac{S12*S21*\Gamma}{1-S22*\Gamma};$$  (eq 7)

Correspondingly by considering port 3 as the second port of a two-port network between ports 1 and 3, the coupling parameters Cij can be derived as follows:
a)

$$C11 = S11 + \frac{S12*S21*\Gamma}{1-S22*\Gamma};$$  (eq 8)

by considering port 3 as the input port and port 2 as the output port of a two-port between ports 2 and 3 we get: b) C33≈S33, since port 3 is essentially de-coupled of the main signal flow. Since port 3 is terminated with 50Ω the incident power wave a3=0; using this fact the additional equation b3=S31*a1+ S32*a2 (eq 10) can be used to calculate the effective coupling factor between ports 1 and 3 in view of a non 50Ω load at port 2 as follows: c)

$$CF = C13 = C31 = S31 + \frac{S32*S12*\Gamma}{1-S22*\Gamma};$$  (eq 11, same as eq 3)

equations 8, 9 and 11 describe fully the coupling behavior of the coupler between ports 1 and 3 under non 50Ω load conditions at port 2. The non 50Ω load at port 2 is in fact created by the impedance tuner, which is connected, externally (FIG. 2) or internally (FIGS. 28, 29) to port 2 of said coupler.

Assuming that S21≈1 (in eq 3), the effect of Γ≠0 becomes apparent if the inverse coupling S32 of the coupler is non-negligible and Γ itself is high (eq. 3). These conditions are fulfilled when low directivity wave-probes [5] or IV probes [4] combined with high reflection tuners are used in a test setup [3]. In this case the coupler must be measured separately of the tuner and the resulting S-parameters must be used together with the tuner calibration data, in this case Γ, in order to correct for the coupling behavior of the coupler under all tuning/Γ conditions. It is false to claim [3, column 10, paragraphs f), g) h)] that the use of an integrated coupling probe makes the tuner calibration superfluous and allows direct measuring of the tuned impedance through the signal receiver. This statement is inaccurate in it; even though the error appears only when above conditions materialize.

If the signal coupler is physically separated from the tuner, calibrating the coupler consists in measuring its 3-port s-parameters (ports 1, 2 and 3), and calibrating the tuner is done using known techniques [6], claims 5 and 6, in which case equations 1, 2 and 3 can be used to calculate the actual reflection and coupling behavior of said signal coupler for every load impedance created by the tuner. The remaining, and yet unsolved task, is to calibrate the coupler and the tuner as an integrated unit in the same housing [3], claim 27. In [3] Simpson does disclose an integrated assembly of signal coupler and impedance tuner, but no method for calibrating it correctly. It is important to notice, that if said coupler-tuner assembly is not calibrated properly, it will yield false measurement data and is therefore useless. The method presented here allows accurate calibration of said integrated assembly. It shall also be noted that even if the signal coupler and the tuner are separate units, it is preferable to calibrate them as a single unit, in order to avoid connecting and disconnecting them, which would create RF repeatability errors.

What has been stated so far for the configuration comprising ports 1, 2 and 3 is equally valid for a configuration comprising ports 2, 1 and 4, if the signal-coupler is used reciprocally.

The calibration method described below is applicable to integrated coupler-tuner assemblies, as well to assemblies that can be separated in a coupler unit and a tuner unit, but are calibrated connected together as a single unit. The calibration method is better understood through FIGS. 28 to 31. FIGS. 30, 31 and 32 show the actual calibration setup of the coupler-tuner assembly on a network analyzer (VNA) whereas FIGS. 28 and 29 show the actual reference plane definitions. FIG. 30 shows the calibration of the multi-element/slug tuner for all element settings using the de-embedding calibration method; FIG. 31 shows the setup for calibration of the signal coupler between the coupled port 3 and the output port 2 and for all settings of said tuner; finally FIG. 32 shows the setup for calibration of the signal coupler between the test port 1 and the coupled port 3 for all settings of said tuner.

In the configuration of FIG. 28 the signal coupling section (281) cannot be physically separated from the impedance control section (282); this is the more generic configuration; the network analyzer RF cables can only be connected to ports 1, 2 and 3, whereas port 4 is terminated with 50Ω (283), therefore a new technique is required, which will allow the creation of a virtual reference port 2' (284) to be used for calibration purposes. This is done in a number of steps: a) the s-parameters of the two-port are measured between ports 1 and 2 with the tuning element/slug (285) retracted from the airline of the tuner, yielding {S0$ij$} for {i,j}={1,2}; port 3 is loaded with 50Ω; b) the s-parameters of the two-port between ports 1 and 3 are measured with the tuning element/slug retracted and port 2 loaded with 50Ω, yielding {S13$ij$} for {i,j}={1,3}; c) the s-parameters of the two-port between ports 2 and 3 are measured with the slug retracted and port 1 loaded with 50Ω, yielding (S23$ij$) for {i,j}={2,3}; d) the two-port assembly between ports 1 and 2 is calibrated on the network analyzer for a number of horizontal (x) and vertical (y) positions of the slug (285) creating reflection factors covering the Smith chart, yielding (STxy,ij) for {i,j}={1,2}; e) the matrix {S0$ij$}$^{-1}$ is cascaded with the matrix {STxyij} for each tuning element/slug position {x,y} (de-embedding), yielding the matrix {S12$xy$,ij}; the first element (S12,$xy$,11) of said matrix (S12xy,ij) is used instead of Γ in equations 1 and 3 above to calculate the two-port behavior of the "signal coupler-tuner" assembly of FIG. 28 for any position {x,y} of the tuner slug (285); g) the results of said calculations are saved in a coupler calibration data file, to be used to correct the signal receiver (FIGS. 1, 2) readings back to the DUT reference plane; h) the tuner calibration data, which have to be presented to the DUT at port 1, are the originally measured {STxy,ij} without any manipulations.

In the configuration of FIG. 29 the procedure is similar to FIG. 28 with the exception that here the tuner comprises more than one tuning elements/slugs (291, 292); in this case the procedure is the same as before, except for steps f) and h): in the case of step f), named here step f1) the s-parameters are calculated for all permutations of the positions x1, y1 and x2, y2 of the two slugs (291, 292) as follows: step f1a) measuring s-parameters of the twoport between port 1 and port 2 for all combinations x1, y1 of slug (291) positions, with ports 3 and 4 terminated with 50Ω and slug (292) retracted from the tuner airline, yielding {ST1xy,ij}; step f1b) measuring s-parameters of the two port between port 1 and port 2 for all combinations x2, y2 of slug (292) positions, with ports 3 and 4 terminated with 50Ω and slug (291) retracted from the tuner airline, yielding (ST2xy,ij); step f1c) cascading $\{S0ij\}^{-1}$ with (ST2xy,ij) (de-embedding), yielding (ST20xy,ij); step f1d) calculating, in the computer memory, all or any permutation needed of positions x1, y1 and x2, y2 (amounting to a maximum of N=x1*y1*x2*y2) of s-parameters in the matrices {ST1} and (ST20) yielding (ST); and finally in step f1e) the element (ST11) is used instead of Γ in equations 1 to 3 to calculate the exact coupling behavior of the "signal-coupler tuner" assembly; finally step h) becomes h1): the tuner calibration data, which have to be presented to the DUT at port 1, are those of the de-embedded matrix {ST}.

In the case of a tuner with more than two tuning elements/slugs the procedure used for the configuration of FIG. 29 applies as well, expanded by measuring the s-parameters of the assembly between ports 1 and 2 for each additional tuning element/slug separately, having all other slugs initialized (retracted from the airline) and cascading said s-parameters with the inverse matrix of the initialized two-port $\{S0ij\}^{-1}$.

In the hereby specification the signal coupler calibration has been dealing with coupled port 3. In the case of a distributed coupler this would be the "forward coupled" port. In the case of an IV sensor based coupler this can be either the E-sensor (voltage or capacitive sensor) or the H-sensor (current or inductive sensor). In either case both, ports 3 and 4 are equivalent for the calculations and what is valid for port 3 is valid equally for port 4 (FIGS. 25 and 28 to 32). In particular FIG. 33 demonstrates the necessary configuration in order to calibrate the sensor assembly between the test port 1 and the coupled port 4. All other configurations and formulas for port 4 are equivalent to those of port 3, by replacing in all s-parameter elements the index 3 with the index 4. The only formal difference is to calculate the coupling factor C41 (the power ratio between the signal detected at port 4 to the signal injected into port 1 (FIG. 25). This can be calculated from:

$$C14 = C41 = S41 + \frac{S42 * S21 * \Gamma}{1 - S22 * \Gamma}; \quad \text{(eq 12; for port 4)}$$

This invention discloses preferred embodiments of adjustable signal-coupling sensors to be used in measuring injected and extracted RF signals from DUT's. The adjustable signal couplers can be cascaded with impedance controlling devices, such as impedance tuners or be integrated in said tuner's housings. The invention also discloses algorithms for accurate calibration of said couplers and tuners for all settings of said tuners, which have not been known before.

Obvious alternatives of the disclosed embodiments of said adjustable couplers shall not impede on the reach of the invention. Obviously modified or re-arranged algorithms for calibration of the network analyzers and de-embedding and for arranging the internal reference planes of the assembly shall not impede on the general validity and claims of the calibration algorithms.

What I claim as my invention is:

1. A microwave signal coupler comprising an input port and an output port and two coupled ports;
   and a low loss slotted transmission airline between said input port and output port;
   said airline having a center conductor and a ground mantle;
   and a capacitive electric field sensor inserted into the slotted transmission airline perpendicularly to the axis of the slotted transmission airline and coupled in a non-contacting manner with the center conductor;
   whereby said electric field sensor comprises a coaxial cable and its protruding center conductor on one the end which is placed in proximity to the center conductor, the other end of said cable being connected with a coupled port;
   and a magnetic field loop sensor comprising a magnetic loop on one end and being attached on a coupled port connector on the other,
   said magnetic loop being placed in proximity of the center conductor and coupled in a non-contacting manner with the center conductor;
   whereby said electric field sensor can be displaced laterally across the width of the slotted transmission airline oriented perpendicularly to the center conductor.

2. A microwave signal coupler comprising an input port and an output port and two coupled ports;
   and a low loss slotted transmission airline between said input port and output port;
   said slotted transmission airline having a center conductor and a ground mantle;
   and a capacitive electric field sensor inserted into the slotted transmission airline perpendicularly to the axis of the slotted transmission airline and coupled in a non-contacting manner with the center conductor;
   and a magnetic field loop sensor inserted into the slotted transmission airline perpendicularly to the axis of the slotted transmission airline having one end coupled in a non-contacting manner with the center conductor and the other end operatively connected with a coupled port;
   whereby at one end the center conductor of said coaxial cable protrudes and connects with the outer ground mantle of said cable forming a magnetic field loop, and whereby the other end of said cable is connected with a coupled port;
   whereby the plan of the magnetic field loop can be rotated around the axis of the coaxial cable,
   whereby a controllable amount of magnetic field energy is captured by said magnetic field loop.

3. A microwave signal coupler comprising an input port and an output port and two coupled ports;
   and a low loss slotted transmission airline between said input port and output port;
   said slotted transmission airline having a center conductor and a ground mantle;
   and a capacitive electric field sensor inserted into the slotted transmission airline perpendicularly to the axis of the slotted transmission airline and coupled in a non-contacting manner with the center conductor;

and a magnetic field loop sensor inserted into the slotted transmission airline perpendicularly to the axis of the slotted transmission airline having one end coupled in a non-contacting manner with the center conductor and the other end operatively connected with a coupled port;

whereby at one end the center conductor of said coaxial cable protrudes and connects with the outer ground mantle of said cable forming a magnetic field loop, and whereby the other end of said cable is connected with a coupled port;

whereby the plan of the magnetic field loop can be displaced laterally across the width of the slotted transmission airline oriented perpendicularly to the center conductor, whereby a controllable amount of magnetic field energy is captured by said magnetic field loop.

4. A microwave signal coupler as in claim 1 or 2 or 3, wherein said coupler is integrated into the housing of a microwave slide screw electro-mechanical impedance tuner, said tuner comprising a test port and an idle port and a slotted airline between said ports, and one or more mobile carriage(s), remotely controllable along the slotted transmission airline axis, said carriage(s) comprising a vertical axis, said axis holding a metallic tuning element, said metallic tuning element being remotely insertable into the slot of said slotted transmission airline and movable, by means of said mobile carriage, along the axis of said slotted transmission airline, whereby said signal coupler is inserted between the tuner test port and the tuner metallic tuning element closest to the test port and shares the slot of the same slotted transmission airline.

* * * * *